United States Patent
Moriwaki et al.

(10) Patent No.: US 11,916,094 B2
(45) Date of Patent: *Feb. 27, 2024

(54) PHOTOELECTRIC CONVERSION PANEL AND METHOD FOR MANUFACTURING PHOTOELECTRIC CONVERSION PANEL

(71) Applicant: Sharp Display Technology Corporation, Kameyama (JP)

(72) Inventors: Hiroyuki Moriwaki, Kameyama (JP); Makoto Nakazawa, Kameyama (JP); Tetsuya Tanishima, Kameyama (JP); Rikiya Takita, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 114 days.

This patent is subject to a terminal disclaimer.

(21) Appl. No.: 17/391,747

(22) Filed: Aug. 2, 2021

(65) Prior Publication Data
US 2023/0030238 A1  Feb. 2, 2023

(51) Int. Cl.
*H01L 27/146* (2006.01)

(52) U.S. Cl.
CPC .. *H01L 27/14663* (2013.01); *H01L 27/14612* (2013.01); *H01L 27/14689* (2013.01); *H01L 27/14692* (2013.01)

(58) Field of Classification Search
CPC ......... H01L 27/14612; H01L 27/14663; H01L 27/14689; H01L 27/14692
See application file for complete search history.

(56) References Cited

U.S. PATENT DOCUMENTS

| | | | | |
|---|---|---|---|---|
| 4,766,085 A | * | 8/1988 | Nishigaki | H01L 27/14665 257/E27.141 |
| 2005/0250308 A1 | * | 11/2005 | Yamaguchi | H01L 27/1214 438/618 |
| 2007/0045556 A1 | * | 3/2007 | Watanabe | H01L 27/14659 257/E27.141 |
| 2008/0210946 A1 | * | 9/2008 | Okada | H01L 27/14603 257/E27.146 |
| 2008/0211045 A1 | * | 9/2008 | Ono | H01L 27/14685 257/E31.127 |
| 2010/0193691 A1 | * | 8/2010 | Ishii | H01L 27/14663 156/247 |
| 2011/0204374 A1 | * | 8/2011 | Kimura | H01L 31/101 438/479 |
| 2012/0032088 A1 | * | 2/2012 | Ishii | H01L 27/14663 250/208.2 |
| 2012/0306041 A1 | * | 12/2012 | Fujiyoshi | H01L 27/1462 257/E31.124 |

(Continued)

FOREIGN PATENT DOCUMENTS

| | | |
|---|---|---|
| JP | 2019-169670 A | 10/2019 |
| WO | 2018/025819 A1 | 2/2018 |

*Primary Examiner* — Blake C Riddick
(74) *Attorney, Agent, or Firm* — ScienBiziP, P.C.

(57) ABSTRACT

A photoelectric conversion panel includes: a thin film transistor; a first organic film formed in an upper layer with respect to the thin film transistor; a photoelectric conversion element formed in an upper layer with respect to the first organic film; and a first inorganic insulating film formed so as to cover at least a part of the first organic film, wherein the first inorganic insulating film has a through hole that exposes a part of the first organic film.

16 Claims, 19 Drawing Sheets

(56) References Cited

U.S. PATENT DOCUMENTS

| | | | | |
|---|---|---|---|---|
| 2013/0140568 A1* | 6/2013 | Miyamoto | H01L 27/14603 | 257/53 |
| 2013/0299711 A1* | 11/2013 | Mochizuki | H01L 27/14643 | 257/292 |
| 2013/0307041 A1* | 11/2013 | Mochizuki | H01L 27/14663 | 257/292 |
| 2014/0035006 A1* | 2/2014 | Fujiyoshi | H01L 27/14812 | 257/225 |
| 2014/0097348 A1* | 4/2014 | Watanabe | H01L 27/14612 | 257/292 |
| 2014/0306869 A1* | 10/2014 | Fujita | H10K 50/11 | 546/4 |
| 2014/0353470 A1* | 12/2014 | Kawanabe | H01L 27/14663 | 438/73 |
| 2014/0353651 A1* | 12/2014 | Takimoto | H01L 27/1464 | 257/40 |
| 2014/0374610 A1* | 12/2014 | Nishino | G01T 1/20184 | 250/370.09 |
| 2015/0003040 A1* | 1/2015 | Bessho | H01L 33/507 | 362/84 |
| 2015/0076358 A1* | 3/2015 | Okada | H01L 27/14609 | 250/370.08 |
| 2015/0188065 A1* | 7/2015 | Takimoto | H01L 27/14685 | 257/40 |
| 2016/0035768 A1* | 2/2016 | Kawahara | H01L 27/14689 | 257/292 |
| 2016/0372520 A1* | 12/2016 | Joei | H10K 30/57 | |
| 2017/0092673 A1* | 3/2017 | Miyamoto | H01L 27/14616 | |
| 2018/0114909 A1* | 4/2018 | Hayashi | H10K 30/00 | |
| 2018/0151624 A1* | 5/2018 | Hasegawa | H10K 30/353 | |
| 2019/0013342 A1* | 1/2019 | Kato | H04N 25/00 | |
| 2019/0019833 A1* | 1/2019 | Kodaira | H01L 27/14623 | |
| 2019/0165183 A1* | 5/2019 | Terai | H10K 77/111 | |
| 2019/0170884 A1 | 6/2019 | Misaki | | |
| 2019/0237692 A1* | 8/2019 | Nakazawa | H10K 30/88 | |
| 2019/0296065 A1 | 9/2019 | Misaki et al. | | |
| 2020/0161360 A1* | 5/2020 | Misaki | H01L 27/14616 | |

* cited by examiner

PHOTOELECTRIC CONVERSION PANEL AND METHOD FOR MANUFACTURING PHOTOELECTRIC CONVERSION PANEL

BACKGROUND

Technical Field

The present disclosure relates to a photoelectric conversion panel and a method for manufacturing a photoelectric conversion panel.

Conventionally, a photoelectric conversion panel including thin film transistors and photoelectric conversion elements has been known. Such a photoelectric conversion panel is disclosed in, for example, JP-A-2019-169670.

JP-A-2019-169670 discloses an active matrix substrate that includes: thin film transistors; a first organic film made of an organic transparent resin formed in an upper layer with respect to the thin film transistors; and photoelectric conversion elements. In this active matrix substrate, an inorganic insulating film is provided so as to cover a part of the first organic film.

SUMMARY

Here, a heating step (a baking step) is carried out in a process for manufacturing a photoelectric conversion panel as is described in JP-A-2019-169670 mentioned above. In a case where heat generated in the heating step is transmitted to the first organic film after the inorganic insulating film is formed is heated, gas is generated in some cases from the first organic film. The gas thus generated from the first organic film then pushes up the already-formed organic insulating film, thereby separating the inorganic insulating film from the first organic film (loosen the inorganic insulating film). This loosening of the inorganic insulating film is considered to result in that some of the elements provided in the photoelectric conversion panel are deformed or electric properties of the elements change in some cases. Besides, in the photoelectric conversion panel including the photoelectric conversion elements, the photoelectric conversion elements are thicker films, as compared with the other layers, and therefore, stress tends to occur to the substrate, which is considered to make the inorganic insulating film particularly in a state of easily separating. To cope with this, a photoelectric conversion panel, and a method for manufacturing a photoelectric conversion panel are desired that make it possible to prevent the inorganic insulating film (the first inorganic insulating film) from separating from a first organic film in the manufacture of the photoelectric conversion panel.

The present disclosure is intended to solve the above-described problem, and it is an object thereof to provide a photoelectric conversion panel and a method for manufacturing a photoelectric conversion panel that make it possible to prevent a first inorganic insulating film from separating from a first organic film in the manufacture of the photoelectric conversion panel.

To achieve the above-described object, a photoelectric conversion panel in a first aspect disclosed below includes: a thin film transistor; a first organic film formed in an upper layer with respect to the thin film transistor; a photoelectric conversion element formed in an upper layer with respect to the first organic film; and a first inorganic insulating film formed so as to cover at least a part of the first organic film, wherein the first inorganic insulating film has a through hole that exposes a part of the first organic film.

A method for manufacturing a photoelectric conversion panel in a second aspect includes: forming a thin film transistor; forming a first organic film in an upper layer with respect to the thin film transistor; forming a photoelectric conversion element in an upper layer with respect to the first organic film; forming a first inorganic insulating film so as to cover at least a part of the first organic film; and forming, in the first inorganic insulating film, a through hole that exposes a part of the first organic film.

With the configurations of the first and second aspects, it is possible to provide such a photoelectric conversion panel that a first inorganic insulating film can be prevented from separating from a first organic film in the manufacture of the photoelectric conversion panel, and a method for manufacturing the photoelectric conversion panel.

DESCRIPTION OF EMBODIMENTS

Figure 1:
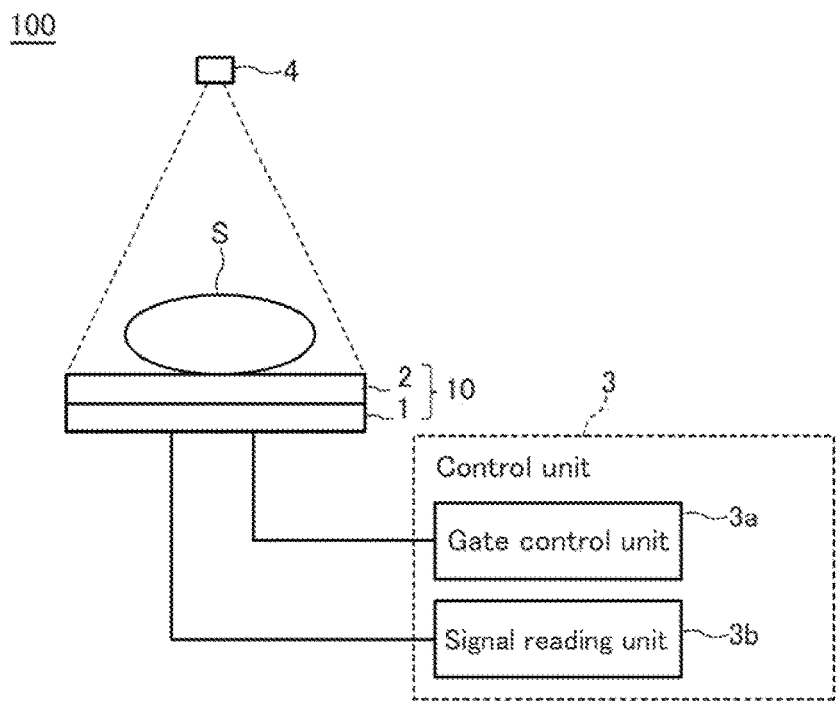
FIG. 1 is a cross-sectional view illustrating a schematic configuration of an X-ray imaging device in Embodiment 1.

The following describes embodiments of the present disclosure, based on the drawings. It should be noted that the present disclosure is not limited to the embodiments shown below, but the design thereof may be appropriately varied in such a manner that the configuration of the present disclosure is satisfied. In addition, in the following description, parts that are identical or have similar functions denoted by the same reference numerals commonly in different drawings, and the descriptions of the same are not repeated. The described constitutional elements of the embodiments and the modification examples may be appropriately combined or varied without departing from the spirit and scope of the present disclosure. To make the description easy to understand, in the drawings referred to hereinafter, the configurations are simply illustrated or schematically illustrated, or the illustration of part of constituent members is omitted. Further, dimension ratios of constituent members illustrated in the drawings do not necessarily indicate actual dimension ratios.

Embodiment 1

(Configuration)

FIG. 1 is a schematic diagram illustrating an X-ray imaging device 100 in Embodiment 1 including a photoelectric conversion panel 1 and an X-ray imaging panel 10. The X-ray imaging device 100 includes the X-ray imaging panel 10 including the photoelectric conversion panel 1 and a scintillator 2, as well as a control unit 3. The control unit 3 includes a gate control unit 3a and a signal reading unit 3b. X-rays are emitted from an X-ray source 4 and are projected to an object S. The X-rays transmitted through the object S are converted into fluorescence (hereinafter referred to as scintillation light) in a scintillator 2 arranged above the photoelectric conversion panel 1. The scintillation light is picked up by the X-ray imaging panel 10, and thereby the X-ray imaging device 100 acquires an X-ray image from the control unit 3.

Figure 2:
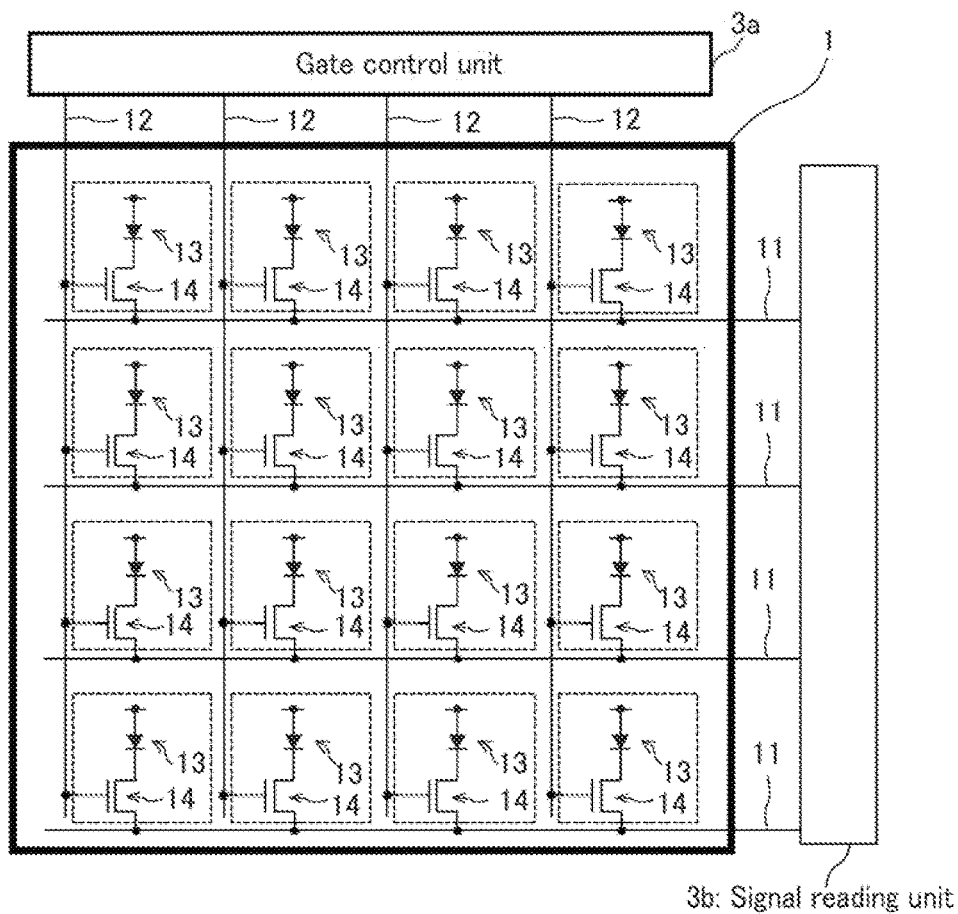
FIG. 2 is a schematic diagram for explaining connection between a photoelectric conversion panel and a control unit.

FIG. 2 is a schematic diagram illustrating a schematic configuration of the photoelectric conversion panel 1. As illustrated in FIG. 2, a plurality of source lines 11 (data lines), and a plurality of gate lines 12 intersecting with the source lines 11, are formed in the photoelectric conversion panel 1. The gate lines 12 are connected with the gate control unit 3a, and the source lines 11 are connected with the signal reading unit 3b.

In the photoelectric conversion panel 1, photodiodes 13 are provided, respectively, in areas (pixels) surrounded by the source lines 11 and the gate lines 12 (hereinafter referred to as pixels). In addition, the photoelectric conversion panel 1 includes thin film transistors (TFTs) 14 connected to the source lines 11 and the gate lines 12, at positions at which the source lines 11 and the gate lines 12 intersect. The photodiode 13 converts scintillation light obtained by converting X-rays transmitted through the object S, into charges according to the amount of the light.

The gate lines 12 in the photoelectric conversion panel 1 are sequentially switched by the gate control unit 3a into a selected state, and the TFT 14 connected to the gate line 12 in the selected state is turned ON. When the TFT 14 is turned ON, a signal according to the charges obtained by the conversion by the photodiode 13 is output through the source line 11 to the signal reading unit 3b.

Figure 3:
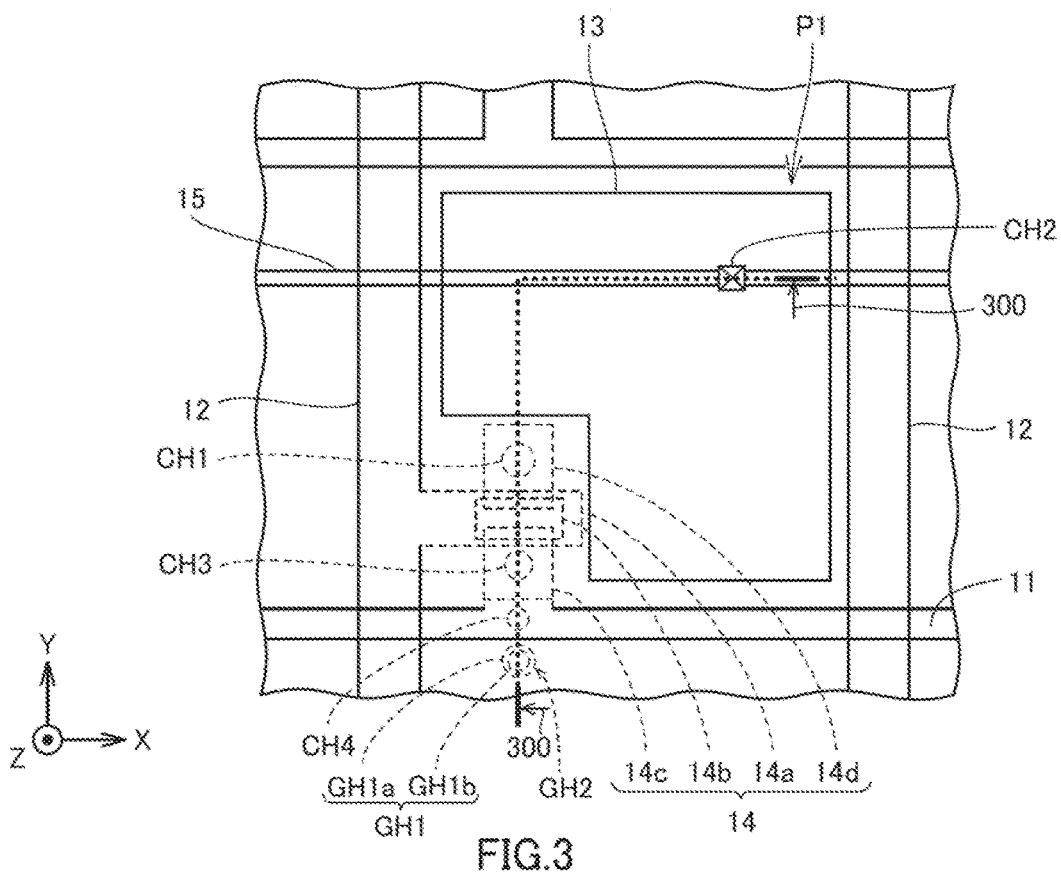
FIG. 3 is a plan view schematically illustrating a configuration of a part of the photoelectric conversion panel.

FIG. 3 is an enlarged plan view of a part of the photoelectric conversion panel 1 illustrated in FIG. 2. As illustrated in FIG. 3, in the area surrounded by the gate lines 12 and the source line 11, the photodiode 13 and the TFT 14 are provided. The photoelectric conversion panel 1 is provided with first lower electrodes 17 connected to the TFTs 14. The photodiode 13 includes a second lower electrode 13a, an upper electrode 13b, and a photoelectric conversion layer 16. The photoelectric conversion layer 16 is provided between the first lower electrode 17 and the second lower electrode 13a on one hand, and the upper electrode 13b on the other hand. Incidentally, a first through hole GH1 (a first hole portion GH1a and a second hole portion GH1b) and a second through hole GH2, which are described below, are provided between adjacent photodiodes 13 when viewed in a plan view. Further, the first through hole GH1 (and the second through hole GH2) are provided in the vicinity of the TFT 14 (particularly, in the vicinity of a semiconductor active layer 14b in a channel part). Still further, the first through hole GH1 (and the second through hole GH2) are provided in the vicinity of the TFT 14, but not immediately above the TFT 14. This configuration makes it possible to prevent the channel part of the TFT 14 from being damaged indirectly by dry etching when the first through hole GH1 (and the second through hole GH2) are formed. As a result, by forming the first through hole GH1 (and the second through hole GH2), a possibility of affecting the properties of the TFT 14 can be reduced.

The TFT 14 includes a gate electrode 14a provided integrally with the gate line 12, a semiconductor active layer 14b, a source electrode 14c connected to the source line 11, and a drain electrode 14d. The drain electrode 14d and the second lower electrode 13a are connected with each other via the first lower electrode 17 provided in a contact hole CH1. The bias line 15 is partially provided in a contact hole CH2, and supplies a bias voltage to the photodiode 13 through the contact hole CH2. The source electrode 14c is connected to the source line 11 via a source connection electrode 11a provided in a contact hole CH3, the source connection electrode 11a being described below.

Figure 4:
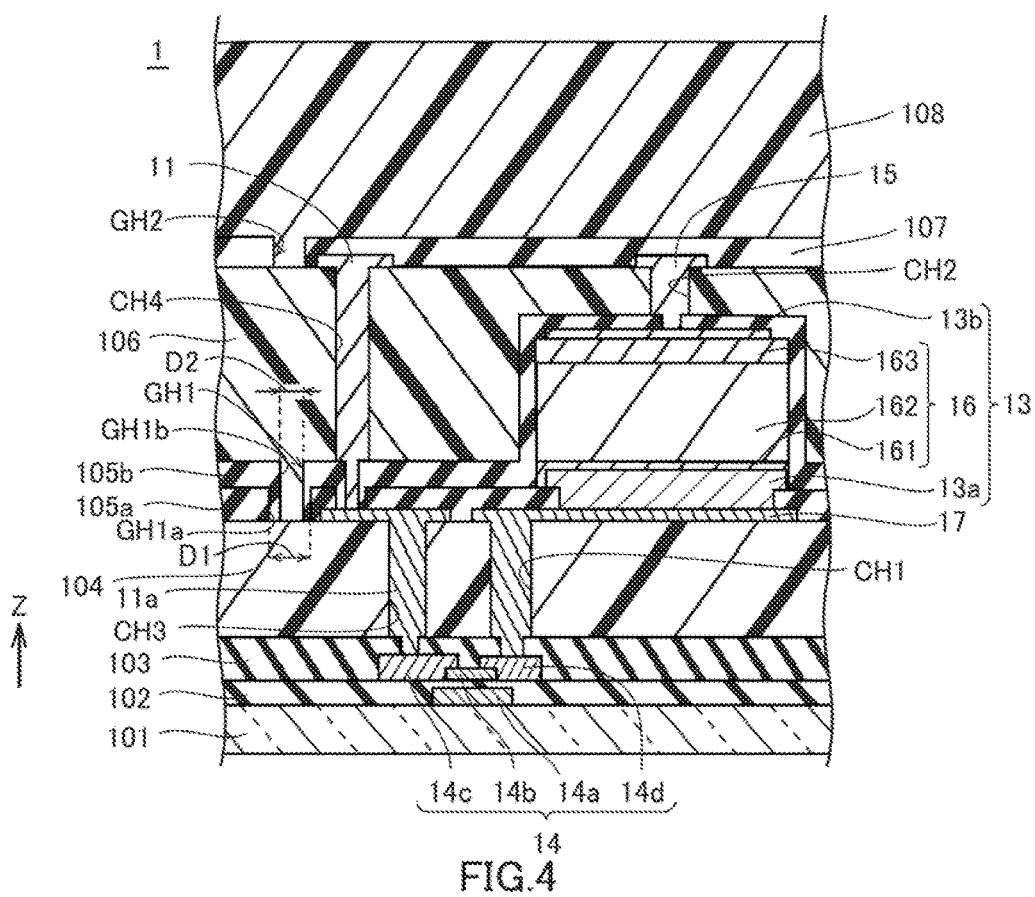
FIG. 4 illustrates a partial cross section taken along the line 300-300 in FIG. 3.

Here, a cross-sectional view taken along line 300-300 in FIG. 3 is illustrated in FIG. 4. Scintillation light converted by the scintillator 2 is incident from a z-axis positive direction side of the photoelectric conversion panel 1 in FIG. 4.

<Configuration of Thin Film Transistor>

As illustrated in FIG. 4, the gate electrode 14a and a gate insulating film 102 are formed on a glass substrate 101. The glass substrate 101 is a substrate having an insulating property. The gate electrode 14a is formed, for example, as a laminated film containing tungsten (W) and tantalum nitride (TaN) as materials.

The gate insulating film 102 covers the gate electrode 14a. The gate insulating film 102 may be formed with, for example, silicon oxide ($SiO_x$), silicon nitride ($SiN_x$), silicon oxide nitride ($SiO_xN_y$) (x>y), or silicon nitride oxide ($SiN_xO_y$) (x>y). In Embodiment 1, the gate insulating film 102 is formed by laminating an insulating film made of silicon oxide ($SiO_x$) in an upper layer and an insulating film made of silicon nitride ($SiN_x$) in a lower layer.

The semiconductor active layer 14b, as well as the source electrode 14c and the drain electrode 14d connected with the semiconductor active layer 14b are provided on the gate electrode 14a with the gate insulating film 102 being interposed therebetween.

The semiconductor active layer 14b is formed in contact with the gate insulating film 102. The semiconductor active layer 14b is made of an oxide semiconductor. In Embodiment 1, the oxide semiconductor contains an IGZO (In—Ga—Zn—O)-based oxide semiconductor. More specifically, for forming the oxide semiconductor, the following material may be used: $InGaO_3(ZnO)_5$; magnesium zinc oxide ($Mg_xZn_{1-x}O$); cadmium zinc oxide ($Cd_xZn_{1-x}O$); cadmium oxide (CdO); or an amorphous oxide semiconductor containing indium (In), gallium (Ga), and zinc (Zn) at a predetermined ratio. With this configuration, the oxidation by a first organic film 104 described below with respect to the TFT 14, and the reduction by a first inorganic insulating film 105a (silicon nitride) with respect to the TFT 14, are optimized, which enables to restrain the TFT from having current-voltage characteristics (I-V characteristics) of the depletion mode.

The source electrode 14c and the drain electrode 14d are arranged so as to be in contact with a part of the semiconductor active layer 14b on the gate insulating film 102. The drain electrode 14d is connected with the first lower electrode 17 provided in the contact hole CH1. The source electrode 14c is connected with the source connection electrode 11a provided in the contact hole CH3. Additionally, the source electrode 14c and the drain electrode 14d are formed on the same layer. The source electrode 14c and the drain electrode 14d have, for example, a three-layer laminate structure in which a metal film made of aluminum (Al) is interposed between two meal films made of titanium (Ti).

A first insulating film 103 is provided on the gate insulating film 102, so as to overlap with the source electrode 14c and the drain electrode 14d. The first insulating film 103 has a first opening (contact portion) on the drain electrode 14d, and a second opening (contact portion) on the source electrode 14c. In this example, the first insulating film 103 is formed with, for example, an inorganic insulating film (single layer film, laminated film) made of silicon oxide ($SiO_2$) or silicon nitride ($SiN_x$).

(Configuration of First Organic Film)

On the first insulating film 103, the first organic film 104 is provided. In other words, the first organic film 104 is formed in an upper layer with respect to the TFT 14. This makes the first organic film 104 have a function as a flattening film for the TFT 14. The first organic film 104 has a first opening (contact portion) on the drain electrode 14d. The first opening of the first insulating film 103 and the first opening of the first organic film 104 form the contact hole CH1. The first organic film 104 has the second opening (contact portion) on the source electrode 14c. The second opening of the first insulating film 103 and the second opening of the first organic film 104 form the contact hole CH3. The first organic film 104 is made of, for example, an organic transparent resin such as an acrylic resin or a siloxane-based resin. In Embodiment 1, the first organic film 104 is made of a photosensitive acrylic resin.

<Configuration of First Lower Electrode and Source Connection Electrode>

On the first organic film 104, the first lower electrode 17 and the source connection electrode 11a are provided. The first lower electrode 17 is partially formed in the contact hole CH1, thereby connecting the drain electrode 14d and the second lower electrode 13a described below. The source connection electrode 11a is partially formed in the contact hole CH3, thereby connecting the source electrode 14c and the source line 11. Each of the first lower electrode 17 and the source connection electrode 11a has, for example, a three-layer laminate structure in which two metal films made of titanium (Ti) having different thicknesses (100 nm and 50 nm) are laminated so that a metal film made of aluminum (Al) (300 nm) is interposed therebetween. Incidentally, each of the first lower electrode 17 and the source connection electrode 11a may have a single layer structure made of aluminum. Here, as the first lower electrode 17 and the source connection electrode 11a contain aluminum, which has a relatively smaller resistance value, the first lower electrode 17 and the source connection electrode 11a have relatively smaller resistance values.

(Configuration of First Inorganic Insulating Film)

On the first lower electrode 17, the first inorganic insulating film 105a is provided so as to partially cover the first lower electrode 17 and the first organic film 104. In the first inorganic insulating film 105a, the first hole portion GH1a forming at least a part of the first through hole GH1 is provided. The first through hole GH1 has a function of releasing, to outside, gas (generated gas) that is generated from the first organic film 104 when the second organic film 106 is formed. The first through hole GH1 also has a function of connecting the first organic film 104 and the second organic film 106. This configuration makes it possible to release gas through the first through hole GH1 to the second organic film 106 side, even in a case where heat for forming the second organic film 106 is transmitted to the first organic film 104, thereby causing gas to be generated from the first organic film 104, in the manufacture of the photoelectric conversion panel 1. Gas molecules are released through interstices of a bond network of the organic film. This restrains gas from accumulating in between the first inorganic insulating film 105a (as well as a second inorganic insulating film 105b to be described below) and the first organic film 104. As a result, it is possible to restrain the first inorganic insulating film 105a (as well as the second inorganic insulating film 105b) from separating from the first organic film 104 in the manufacture of the photoelectric conversion panel 1, even in a case where the photoelectric conversion panel 1 includes the first organic film 104 and the second organic film 106. In addition, this also restrains gas from accumulating in between the source connection electrode 11a as well as the first lower electrode 17 (photodiode 13), and the first organic film 104. This makes it possible to restrain the source connection electrode 11a from separating from the first organic film 104, and to restrain the photodiode 13 from separating from the first organic film 104.

Further, the first inorganic insulating film 105a functions as a film coating the first lower electrode 17. This configuration enables to release gas from the first organic film 104 to the second organic film 106 side through the first hole portion GH1a (the first through hole GH1) of the first inorganic insulating film 105a in the manufacture of the photoelectric conversion panel 1, even in a case where the photoelectric conversion panel 1 includes the photodiode 13 having the first lower electrode 17.

The first inorganic insulating film 105a may be formed with, for example, silicon oxide ($SiO_x$), silicon nitride ($SiN_x$), silicon oxide nitride ($SiO_xN_y$) (x>y), or silicon nitride oxide ($SiN_xO_y$) (x>y). In Embodiment 1, the first inorganic insulating film 105a is formed with silicon oxynitride ($SiN_x$). Further, in the first inorganic insulating film 105a, a first opening (contact portion), in which the second lower electrode 13a is to be provided, is provided on the first lower electrode 17. Still further, in the first inorganic insulating film 105a, a second opening (contact portion) in which the source line 11 is to be provided is provided on the source connection electrode 11a.

The first inorganic insulating film 105a has a thickness of, for example, 100 nm or more and 500 nm or less. This film thickness makes it possible to restrain the first lower electrode 17 from becoming exposed when the photoelectric conversion layer 16 is etched in the manufacture of the photoelectric conversion panel 1. Incidentally, in Embodiment 1, the first inorganic insulating film 105a has a thickness of, for example, 350 nm.

<Configuration of Second Lower Electrode>

The second lower electrode 13a is provided so as to cover the first opening of the first inorganic insulating film 105a and a part of the first inorganic insulating film 105a. The second lower electrode 13a is formed with titanium (Ti), which has a resistance higher than that of aluminum (Al). The second lower electrode 13a has a thickness of, for example, 10 nm or more and 50 nm or less. This film thickness makes it possible to restrain a part of the second lower electrode 13a from scattering when the photoelectric conversion layer 16 is etched in the manufacture of the photoelectric conversion panel 1. Incidentally, in Embodiment 1, the second lower electrode 13a has a thickness of 30 nm.

<Configuration of Photoelectric Conversion Layer>

On the second lower electrode 13a, the photoelectric conversion layer 16 is provided. The photoelectric conversion layer 16 is composed of an n-type amorphous semiconductor layer 161, an intrinsic amorphous semiconductor layer 162, and a p-type amorphous semiconductor layer 163, which are laminated in the order. The n-type amorphous semiconductor layer 161 is made of amorphous silicon doped with an n-type impurity (for example, phosphorus). The intrinsic amorphous semiconductor layer 162 is made of intrinsic amorphous silicon. The intrinsic amorphous semiconductor layer 162 is formed in contact with the n-type amorphous semiconductor layer 161. The p-type amorphous semiconductor layer 163 is made of amorphous silicon doped with a p-type impurity (for example, boron). The p-type amorphous semiconductor layer 163 is formed in contact with the intrinsic amorphous semiconductor layer 162.

On the photoelectric conversion layer 16, the upper electrode 13b is provided. The upper electrode 13b is made of, for example, indium tin oxide (ITO). In other words, the photodiode 13 is formed in an upper layer with respect to the first organic film 104.

(Configuration of Second Inorganic Insulating Film)

The second inorganic insulating film 105b is provided so as to cover at least a part of the photodiode 13 and the first inorganic insulating film 105a. The second inorganic insulating film 105b covers a part of the top surface of the photodiode 13 and side surfaces of the photodiode 13. This allows the second inorganic insulating film 105b to function as a passivation film and a coating film for the photodiode 13, the first lower electrode 17, and the source connection electrode 11a.

Here, in Embodiment 1, the second hole portion GH1b, constituting at least a part of the first through hole GH1, is provided in the second inorganic insulating film 105b. The first through hole GH1 is composed of the first hole portion GH1a and the second hole portion GH1b. More specifically, the second inorganic insulating film 105b is formed so as to coat the inner surface of the first hole portion GH1a, thereby forming the second hole portion GH1b, and in this way, the first through hole GH1 is formed. this configuration enables to release gas from the first organic film 104 to the second organic film 106 side through the first through hole GH1 in the manufacture of the photoelectric conversion panel 1, even in a case where the second inorganic insulating film 105b covering at least a part of the first inorganic insulating film 105a is provided in the photoelectric conversion panel 1. Other than the above-described configuration in which the first hole portion GH1a and the second hole portion GH1b are separately formed, the following configuration is also possible: the first hole portion GH1a is not formed, and a hole going through the second inorganic insulating film 105b to reach the first organic film 104 is formed when the second hole portion GH1b is formed (for example, in Embodiment 2). This makes it possible to reduce the area of the whole contact hole.

Further, the second hole portion GH1b is provided at a position overlapping with the first hole portion GH1a when viewed in a plan view (see FIG. 3). This configuration allows the first hole portion GH1a and the second hole portion GH1b to be easily connected, thereby making it possible to form the first through hole GH1 in the photoelectric conversion panel 1 easily. Further, the second hole portion GH1b is provided at a position not overlapping with the photodiode 13 when viewed in a plan view. This configuration allows the first organic film 104 and the second organic film 106 to be easily connected, even in a case where the photodiode 13 is provided in the photoelectric conversion panel 1. As a result, it is possible to easily release gas from the first organic film 104 to the second organic film 106 side in the manufacture of the photoelectric conversion panel 1.

In addition, the second inorganic insulating film 105b is formed so as to coat the inner surface of the first hole portion GH1a. Accordingly, the diameter D1 of the second hole portion GH1b is smaller than the diameter D2 of the first hole portion GH1a. In this example, the second inorganic insulating film 105b is formed with, for example, an inorganic insulating film made of silicon nitride ($SiN_x$).

Still further, in the second inorganic insulating film 105b, a first opening (contact) is provided on the upper electrode 13b, and a second opening (contact) is provided on the source connection electrode 11a.

(Configuration of Second Organic Film)

The second organic film 106 is provided, which is formed in an upper layer with respect to the first organic film 104, covers at least a part of the second inorganic insulating film 105b, and is partially filled in the second hole portion GH1b. The second organic film 106 has a function as a flattening film for flattening step parts formed by the photodiode 13. Besides, the second organic film 106 is in contact with the first organic film 104, for example, at the second hole portion GH1b (the first through hole GH1). The second organic film 106 is made of, for example, the same material as that of the first organic film 104. The second organic film 106 is made of, for example, an organic transparent resin such as an acrylic resin or a siloxane-based resin. In Embodiment 1, the second organic film 106 is made of a photosensitive acrylic resin. With this configuration, the first organic film 104 and the second organic film 106, which are made of the same material, are connected with each other in the first through hole GH1, which enables the first organic film 104 and the second organic film 106 to easily expand and contract in the vertical direction (make them flexible).

Further, in the second organic film 106, there are provided a first opening that forms the contact hole CH2 together with the first opening of the second inorganic insulating film 105b, and a second opening that forms the contact hole CH4 together with the second opening of the second inorganic insulating film 105b.

(Configuration of Bias Line and Source Line)

On the second organic film 106, the bias line 15 and the source line 11 are provided. The bias line 15 is in contact with the upper electrode 13b at the contact hole CH2. The source line 11 is in contact with the source connection electrode 11a at the contact hole CH2.

The bias line 15 is connected to the control unit 3 (see FIG. 1). The bias line 15 applies a bias voltage fed from the control unit 3 through the contact hole CH2 to the upper electrode 13b. The source line 11 is connected to the control unit 3 (see FIG. 1). The source line 11 goes through the contact hole CH4, and when the TFT 14 is turned ON, a signal according to the charges obtained by the conversion by the photodiode 13 is output through the source line 11 to the signal reading unit 3b. Each of the source line 11 and the bias line 15 is formed with, for example, a laminated metal film composed of Ti, aluminum, Ti, and ITO in this order from the bottom layer. Aluminum contained in the source line 11 and the bias line 15 contributes to the reduction of the resistance, which is important for line properties. Ti forms a barrier layer that prevents surface oxidation of aluminum. ITO contained in the source line 11 and the bias line 15 makes it possible to form a terminal for external mounting in the same layer. Incidentally, in a case where the source line 11, the bias line 15, and the terminal for external mounting are not formed in the same layer, ITO does not have to be contained in the source line 11 and the bias line 15.

(Configuration of Third Inorganic Insulating Film)

On the second organic film 106, the third inorganic insulating film 107 is provided so as to cover the source line 11 and the bias line 15. The third inorganic insulating film 107 is made of, for example, silicon nitride (SiN). The third inorganic insulating film 107 is formed so as to cover the second organic film 106, and the second through hole GH2 is provided, which connects the second organic film 106 and a third organic film 108 described below. Further, the third inorganic insulating film 107 functions as a passivation film. The second through hole GH2 has a function of releasing gas (generated gas) from the second organic film 106, in a step of forming the third organic film 108 in the manufacture of the photoelectric conversion panel 1. This configuration enables to release gas generated from the second organic film 106 to the third organic film 108 side through the second through hole GH2 in the manufacture of the photoelectric conversion panel 1, even in a case where the third organic film 108 is provided in the photoelectric conversion panel 1.

Besides, in Embodiment 1, the second through hole GH2 is provided at a position overlapping with the first through hole GH1 when viewed in a plan view. This configuration makes it possible to form the second through hole GH2 easily, as compared with a case where the second through hole GH2 is formed at a position different from that of the first through hole GH1 when viewed in a plan view. In addition, as the distance between GH1 and GH2 is shortest, gas can be released through the shortest route.

(Configuration of Third Organic Film)

The third organic film 108 is provided so as to cover the third inorganic insulating film 107. The third organic film 108 is formed in an upper layer with respect to the second organic film 106, covers the third inorganic insulating film 107, and is partially filled in the second through hole GH2. The third organic film 108 has a function as a protective film for protecting the third inorganic insulating film 107 and the like. Besides, the third organic film 108 is in contact with the second organic film 106, for example, at the second through hole GH2. The third organic film 108 is made of, for example, the same material as that of the second organic film 106. The third organic film 108 is made of, for example, an organic transparent resin such as an acrylic resin or a siloxane-based resin. In Embodiment 1, the third organic film 108 is made of a photosensitive acrylic resin.

(Method for Manufacturing Photoelectric Conversion Panel)

Figure 5:
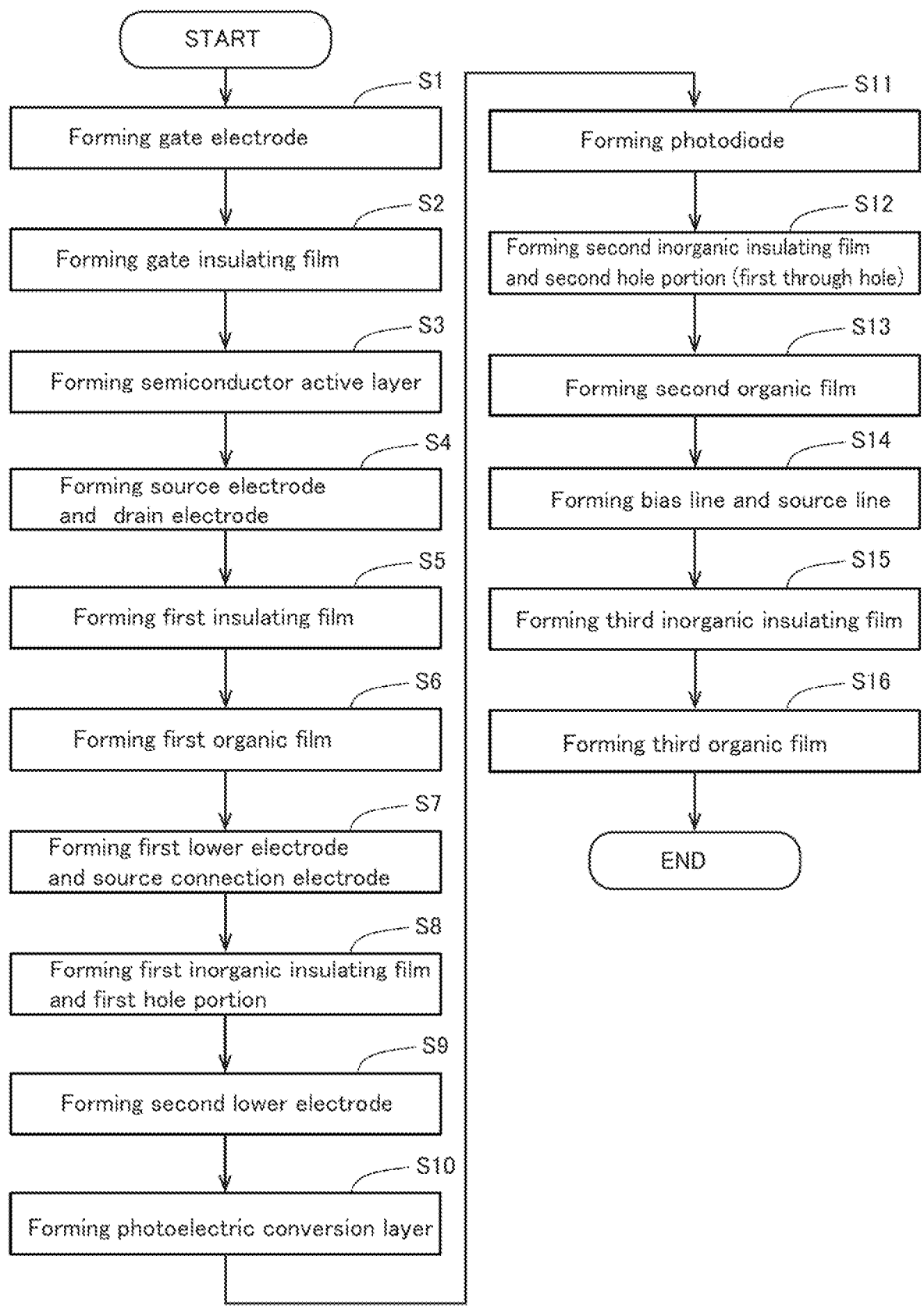
FIG. 5 is a flowchart for explaining a process for manufacturing a photoelectric conversion panel in Embodiment 1.

The following description describes a method for manufacturing the photoelectric conversion panel 1 while referring to FIGS. 5 to 20. FIG. 5 is a flowchart for explaining a process for manufacturing a photoelectric conversion panel 1. FIGS. 6 to 20 are cross-sectional views illustrating respective steps in the process for manufacturing the photoelectric conversion panel 1 (cross sections taken along line 300-300 in FIG. 3)

Figure 6:
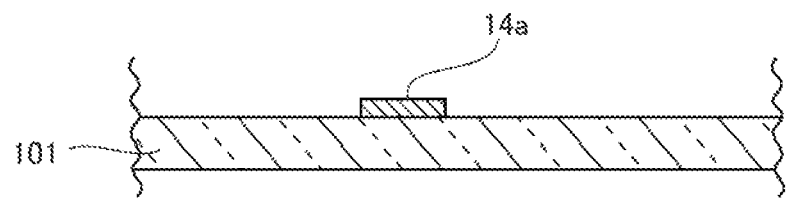
FIG. 6 is a diagram for explaining a step of forming a gate electrode.

As illustrated in FIG. 6, the gate electrode 14a is formed on the glass substrate 101 at Step S1. More specifically, a laminated film made of tungsten (W) and tantalum nitride (TaN) is formed on the glass substrate 101 by, for example, sputtering. Then, photolithography and dry etching are performed, whereby the gate electrode 14a is formed.

Figure 7:
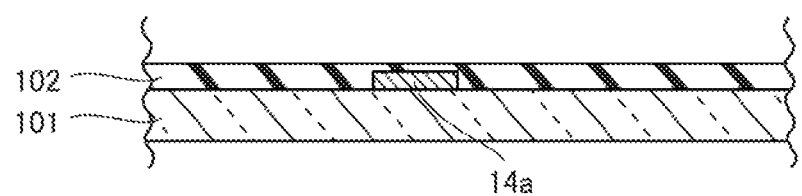
FIG. 7 is a diagram for explaining a step of forming a gate insulating film.

As illustrated in FIG. 7, the gate insulating film 102 is formed at Step S2 so as to cover the gate electrode 14a. For example, a laminated film of silicon oxide ($SiO_x$) and silicon nitride ($SiN_x$) is formed by CVD, whereby the gate insulating film 102 is formed.

Figure 8:
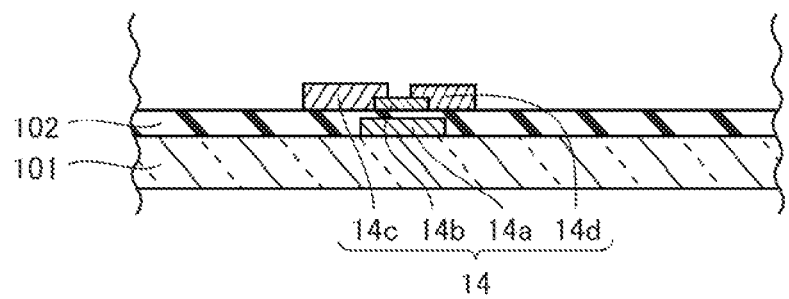
FIG. 8 is a diagram for explaining a step of forming a semiconductor active layer, a source electrode, and a drain electrode.

As illustrated in FIG. 8, the semiconductor active layer 14b is formed on the gate electrode 14a, with the gate insulating film 102 being interposed therebetween, at Step S3. For example, IGZO (In—Ga—Zn—O)-based oxide semiconductor is formed by sputtering, and photolithography and dry etching are performed, whereby the semiconductor active layer 14b is formed. Though not illustrated, a gate contact is formed by photolithography and dry etching performed in this step.

Further, at Step S4, the source electrode 14c and the drain electrode 14d are formed. For example, a laminated film in which a metal film made of aluminum (Al) is interposed between two metal films made of titanium (Ti) is formed by sputtering. Then, photolithography and dry etching are performed, whereby the source electrode 14c and the drain electrode 14d are formed.

Figure 9:
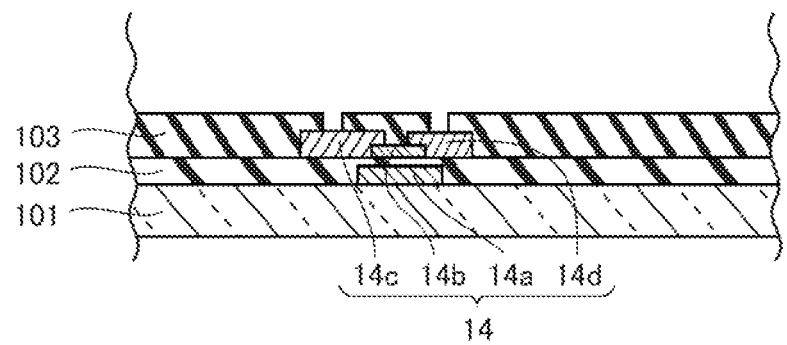
FIG. 9 is a diagram for explaining a step of forming a first insulating film.

As illustrated in FIG. 9, the first insulating film 103 is formed at Step S5 on the gate insulating film 102 so as to overlap with the source electrode 14c and the drain electrode 14d. For example, an inorganic insulating film (single layer film) made of silicon oxide ($SiO_2$) is formed by CVD. Then, photolithography and dry etching are performed, whereby the first insulating film 103 is formed. At this step, in the first insulating film 103, the first opening and the second opening are also formed on the drain electrode 14d and the source electrode 14c, respectively.

Figure 10:
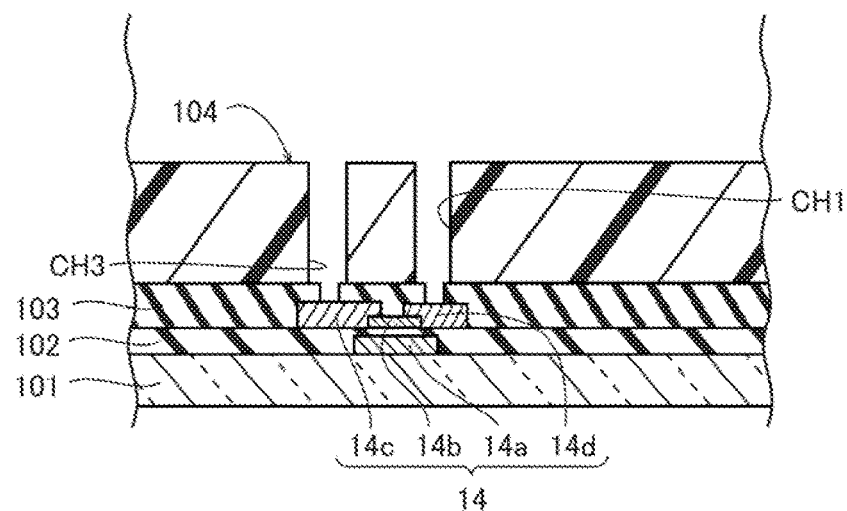
FIG. 10 is a diagram for explaining a step of forming a first organic film.

As illustrated in FIG. 10, the first organic film 104 is formed at Step S6 on the first insulating film 103 (in an upper layer with respect to the TFT 14). For example, the first organic film 104 is formed by applying a photosensitive acrylic resin over the first insulating film 103. In addition, at this step, baking (a step of heating to, for example, 200° C.) is carried out. Then, photolithography and dry etching are performed, whereby the first opening (contact hole CH1) is formed on the drain electrode 14d of the first organic film 104, and the second opening (contact hole cH3) is formed on the source electrode 14c of the first organic film 104.

Figure 11:
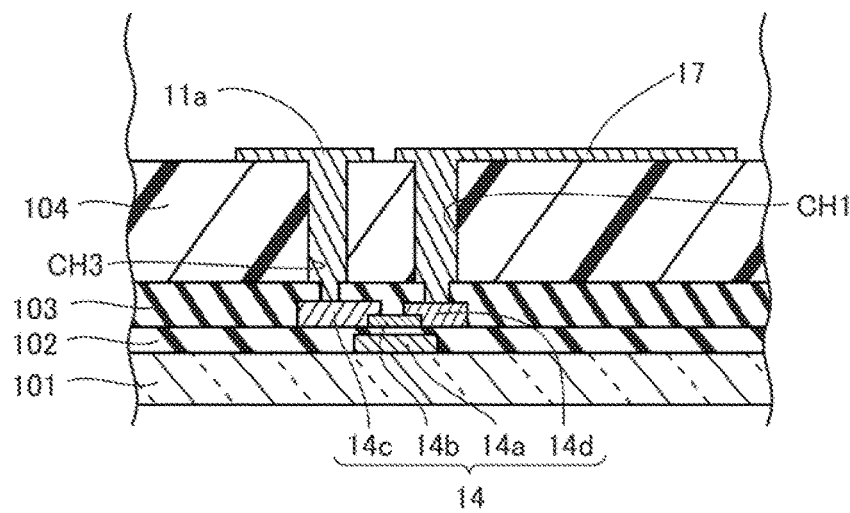
FIG. 11 is a diagram for explaining a step of forming a first lower electrode and a source connection electrode.

As illustrated in FIG. 11, at Step S7, the first lower electrode 17 and the source connection electrode 11a are formed on the first organic film 104. For example, either a single layer film of aluminum (Al), or a laminated film in which a metal film made of aluminum (Al) is interposed between two metal films made of titanium (Ti), is formed by sputtering. Then, photolithography and dry etching are performed, whereby the first lower electrode 17 and the source connection electrode 11a are formed.

Figure 12:
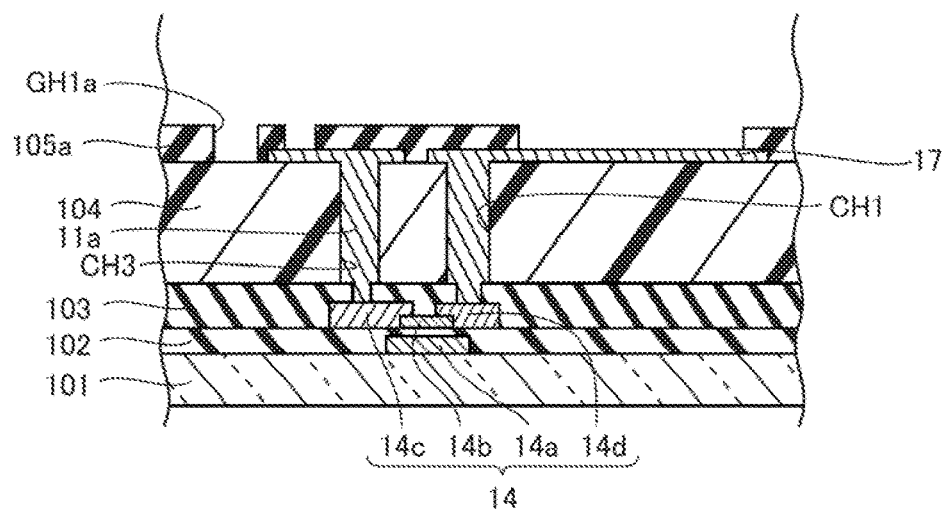
FIG. 12 is a diagram for explaining a step of forming a first inorganic insulating film.

As illustrated in FIG. 12, at Step S8, the first inorganic insulating film 105a partially covering the first lower electrode 17 and the first organic film 104 is formed on the first lower electrode 17. For example, an inorganic insulating film (single layer film) made of silicon nitride ($SiN_x$) is formed by CVD, and photolithography and dry etching are performed, whereby the first inorganic insulating film 105a is formed. Incidentally, the first inorganic insulating film 105a may be formed, not with silicon nitride ($SiN_x$), but with silicon oxide ($SiO_2$). In addition, at this step, the first hole portion GH1a forming at least a part of the first through hole GH1 is formed in the first inorganic insulating film 105a. Further, at this step, in the first inorganic insulating film 105a, the first opening in which the second lower electrode 13a is provided is formed on the first lower electrode 17. Still further, in the first inorganic insulating film 105a, a second opening in which the source line 11 is provided is formed on the source connection electrode 11a. The first inorganic insulating film 105a has a thickness of, for example, 100 nm or more and 500 nm or less. This film thickness makes it possible to restrain the first lower electrode 17 from becoming exposed when the photoelectric conversion layer 16 is etched (Step S11).

Figure 13:
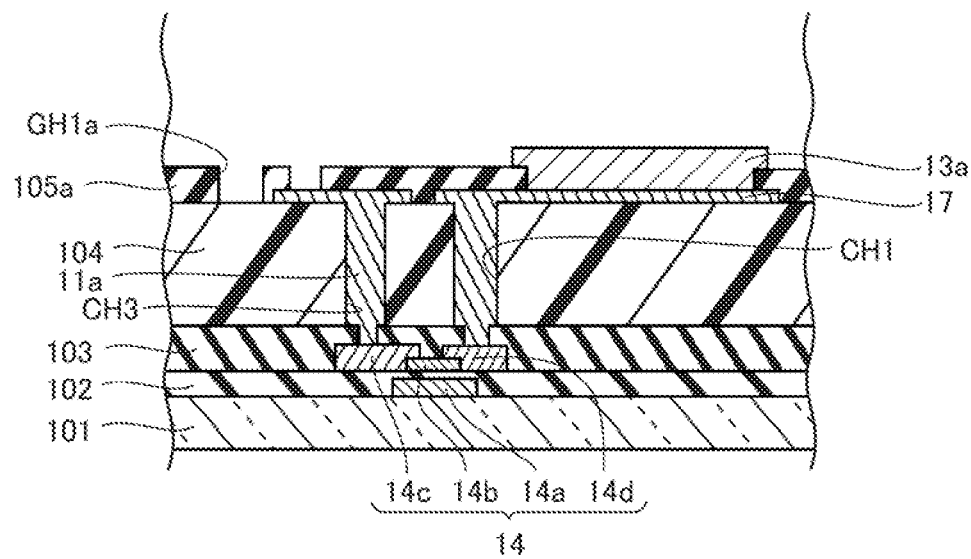
FIG. 13 is a diagram for explaining a step of forming a second lower electrode.

As illustrated in FIG. 13, at Step S9, the second lower electrode 13a is formed so as to cover the first opening of the first inorganic insulating film 105a and a part of the first inorganic insulating film 105a. For example, a metal film made of titanium (Ti) is formed by sputtering, and photolithography and dry etching are performed, whereby the second lower electrode 13a is formed. Here, surrounding parts other than the part that becomes the photoelectric conversion layer 16 are removed before the step of forming the photoelectric conversion layer 16 (Step S11). This makes it possible to restrain materials facing the side surface (side wall) of the photoelectric conversion layer 16 from scattering at the step of forming the photoelectric conversion layer 16. The second lower electrode 13a having a thickness of, for example, 10 nm or more and 50 nm or less, is formed. This film thickness makes it possible to restrain a part of the second lower electrode 13a from scattering when the photoelectric conversion layer 16 is etched. Incidentally, in Embodiment 1, the second lower electrode 13a has a thickness of 30 nm.

Figure 14:
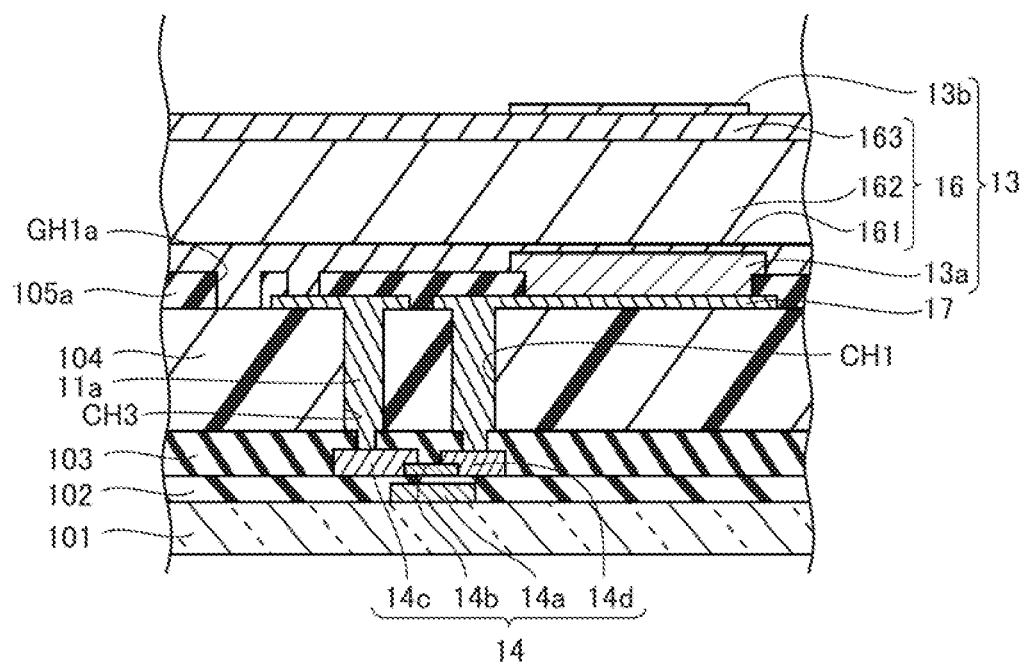
FIG. 14 is a diagram for explaining a step of forming a photoelectric conversion layer.

As illustrated in FIG. 14, at Step S10, the photoelectric conversion layer 16 is formed on the second lower electrode 13a. For example, the n-type amorphous semiconductor layer 161 made of amorphous silicon doped with an n-type impurity (for example, phosphorus), the intrinsic amorphous semiconductor layer 162 made of intrinsic amorphous semiconductor, and the p-type amorphous semiconductor layer 163 made of amorphous silicon doped with a p-type impurity (for example, boron), are laminated in this order by CVD.

Then, on the photoelectric conversion layer 16, the upper electrode 13b is formed. For example, a film of ITO is formed by sputtering. Then, photolithography and dry etching are performed, whereby the upper electrode 13b is formed. Incidentally, after the upper electrode 13b is formed, it may be treated with hydrogen plasma or the like, so that damage caused by etching of side walls of the photoelectric conversion layer 16 should be repaired. In this case, after the film of ITO is formed, a passivation film for covering the film of ITO until the etching step may be formed.

Figure 15:
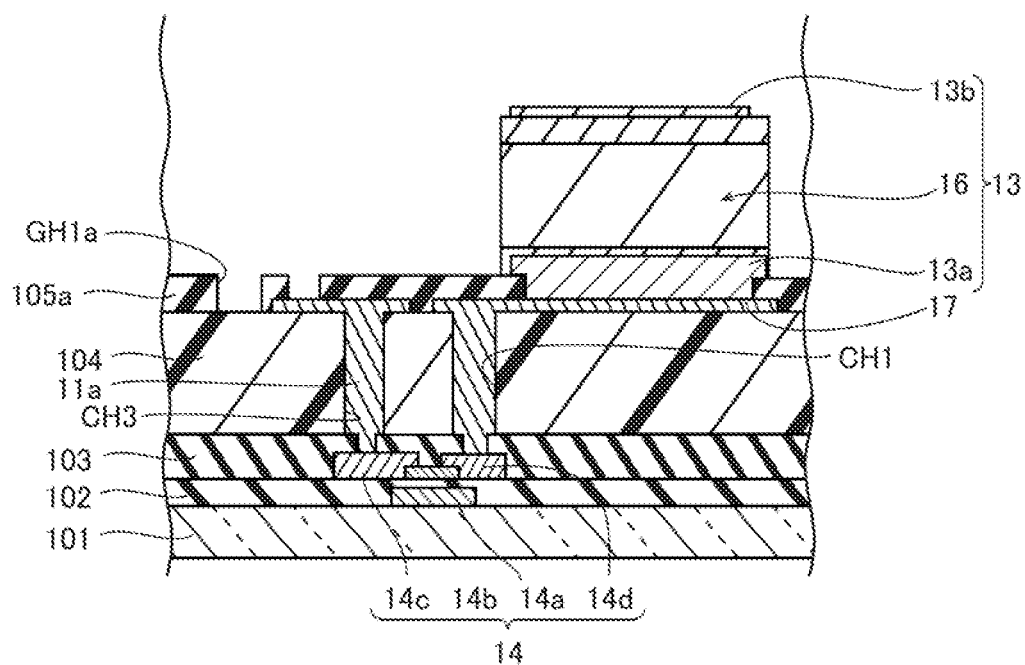
FIG. 15 is a diagram for explaining a step of forming a photodiode.

As illustrated in FIG. 15, photolithography and dry etching are performed at Step S11, whereby the photoelectric conversion layer 16 is formed, and the photodiode 13 is formed.

Figure 16:
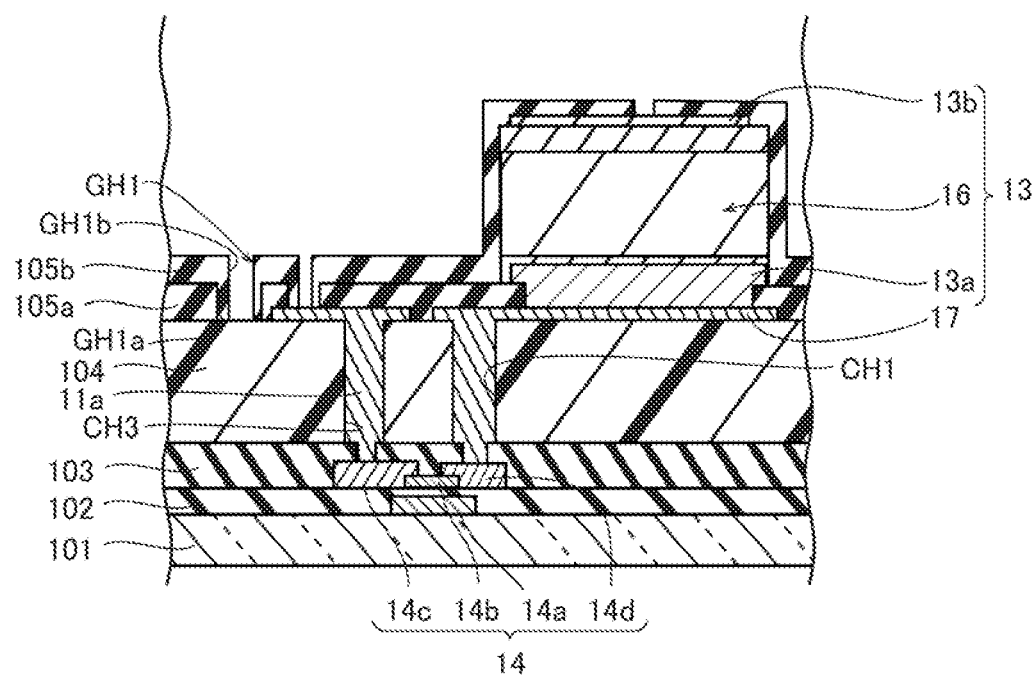
FIG. 16 is a diagram for explaining a step of forming a second inorganic insulating film.

As illustrated in FIG. 16, at Step S12, the second inorganic insulating film 105b is formed so as to cover at least a part of the photodiode 13 and the first inorganic insulating film 105a. For example, an inorganic insulating film made of silicon nitride ($SiN_x$) is formed by CVD, and photolithography and dry etching are performed, whereby the second inorganic insulating film 105b is formed. In addition, at this step, the second hole portion GH1b forming at least a part of the first through hole GH1 is formed in the second inorganic insulating film 105b. Still further, at this step, in the second inorganic insulating film 105b, the first opening (contact) is formed on the upper electrode 13b, and the second opening (contact) is formed on the source connection electrode 11a.

Figure 17:
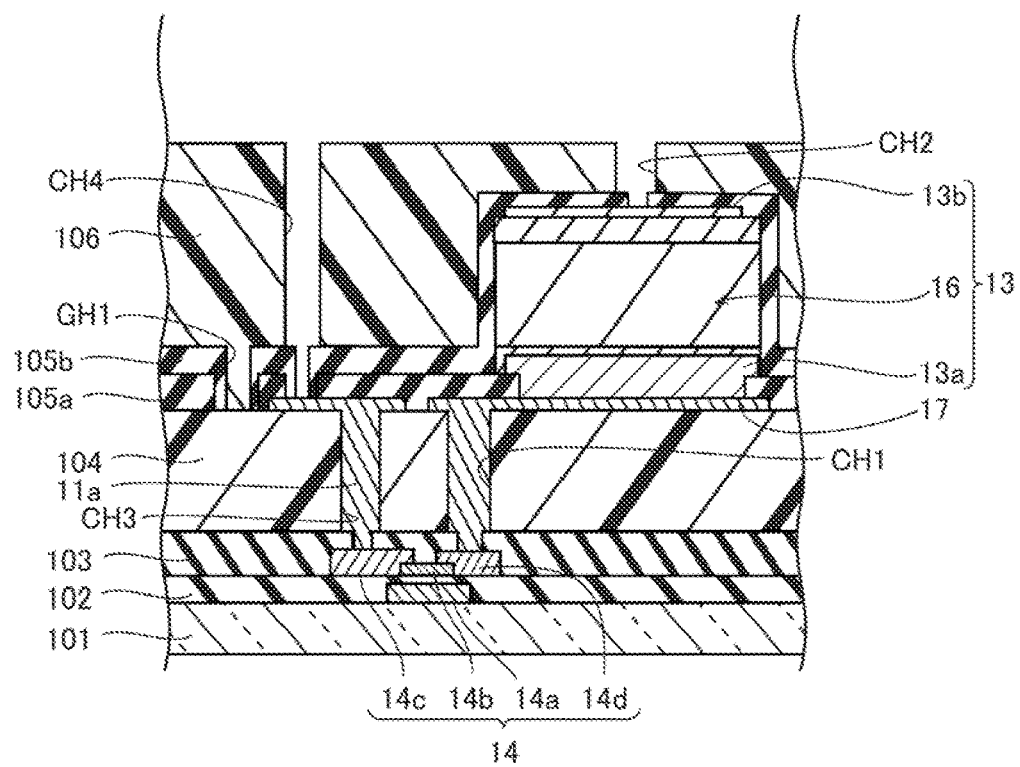
FIG. 17 is a diagram for explaining a step of forming a second organic film.

As illustrated in FIG. 17, at Step S13, the second organic film 106 is formed in an upper layer with respect to the first organic film 104, so as to cover at least a part of the second inorganic insulating film 105b, and to be partially filled in the second hole portion GH1b. For example, by applying a photosensitive acrylic resin over the second inorganic insulating film 105b, the second organic film 106 is formed. In addition, at this step, baking (a step of heating to, for example, 200° C.) of the second organic film 106 or the photosensitive acrylic resin is carried out. Here, heat transmitted also to the first organic film 104 causes gas to be generated in some cases. However, even in a case where gas is generated from the first organic film 104 due to heat, the gas can be released through the first through hole GH1 to the second organic film 106 side. It is considered that gas molecules are released through interstices of a bond network of the organic film. This restrains gas from accumulating in between the first inorganic insulating film 105a (as well as a second inorganic insulating film 105b to be described below) and the first organic film 104. As a result, it is possible to restrain the first inorganic insulating film 105a (as well as the second inorganic insulating film 105b) from separating from the first organic film 104. In addition, this also restrains gas from accumulating in between the source connection electrode 11a as well as the first lower electrode 17 (photodiode 13), and the first organic film 104. This makes it possible to restrain the source connection electrode 11a from separating from the first organic film 104, and to restrain the photodiode 13 from separating from the first organic film 104. Then, with photolithography and dry etching performed, the first opening that forms the contact hole CH2 together with the first opening of the second inorganic insulating film 105b, and the second opening that forms the contact hole CH4 together with the second opening of the second inorganic insulating film 105b, are formed in the second organic film 106.

Figure 18:
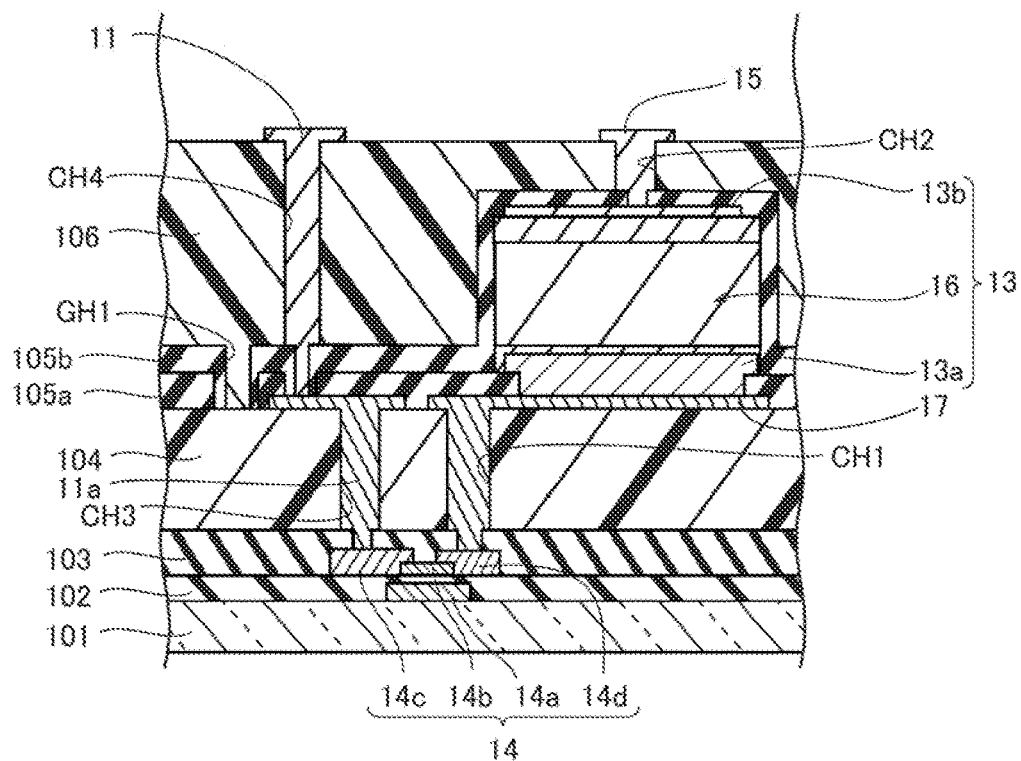
FIG. 18 is a diagram for explaining a step of forming a bias line and a source line.

As illustrated in FIG. 18, at Step S14, the bias line 15 and the source line 11 are formed on the second organic film 106. For example, an ITO film, as well as a film made of titanium (Ti), aluminum (Al), and titanium (Ti), are formed by sputtering, and wet etching as well as dry etching are performed, whereby the bias line 15 and the source line 11 are formed.

Figure 19:
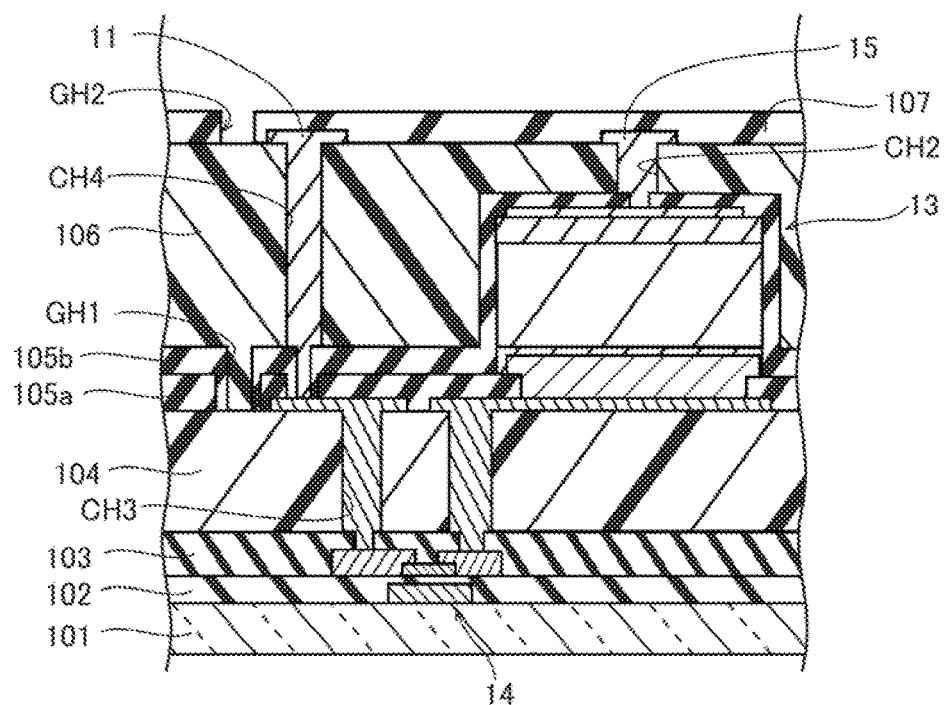
FIG. 19 is a diagram for explaining a step of forming a third inorganic insulating film.

As illustrated in FIG. 19, at Step S15, the third inorganic insulating film 107 is formed so as to cover the source line 11 and the bias line 15 on the second organic film 106. For example, an inorganic insulating film made of silicon nitride ($SiN_x$) is formed by CVD, and photolithography and dry etching are performed, whereby the third inorganic insulating film 107 is formed. In addition, at this step, the second through hole GH2 connecting the second organic film 106 and the third organic film 108 is formed in the third inorganic insulating film 107.

Figure 20:
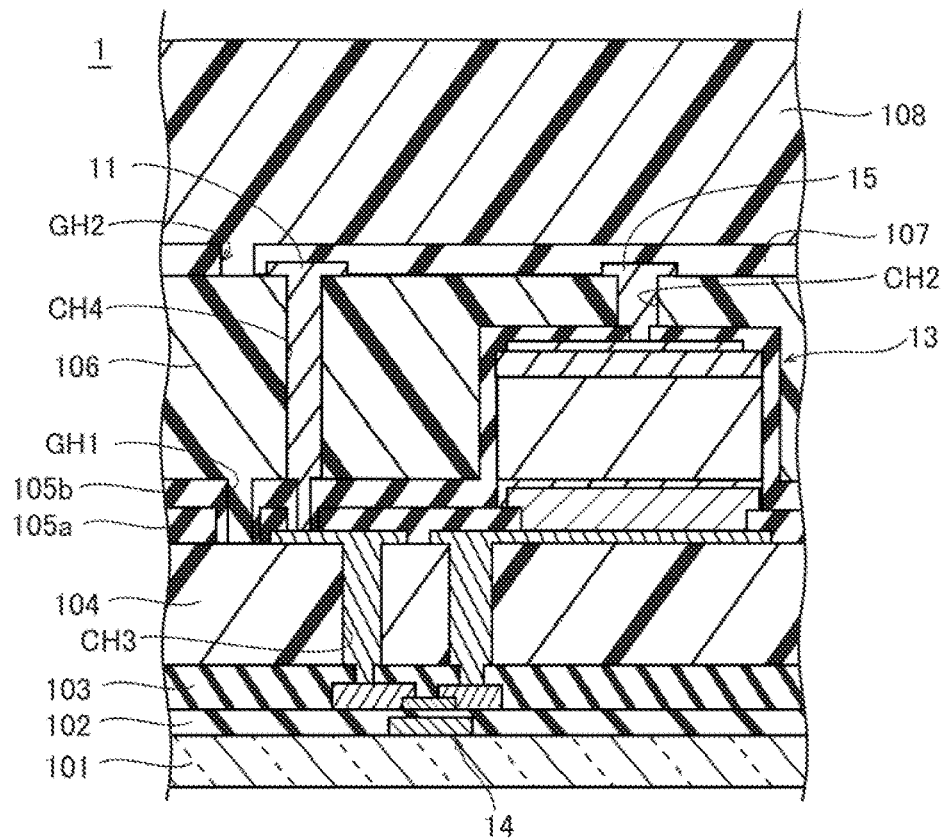
FIG. 20 is a diagram for explaining a step of forming a third organic film.

As illustrated in FIG. 20, at Step S16, the third organic film 108 is formed so as to cover the third inorganic insulating film 107. The third organic film 108 is formed in an upper layer with respect to the second organic film 106, covers the third inorganic insulating film 107, and is partially filled in the second through hole GH2. For example, by applying a photosensitive acrylic resin over the second inorganic insulating film 105b, the second organic film 106 is formed. In addition, at this step, baking (a step of heating to, for example, 200° C.) is carried out. Here, gas generated from the second organic film 106 is released through the second through hole GH2 and the third organic film 108 to outside.

Embodiment 2

Figure 21:
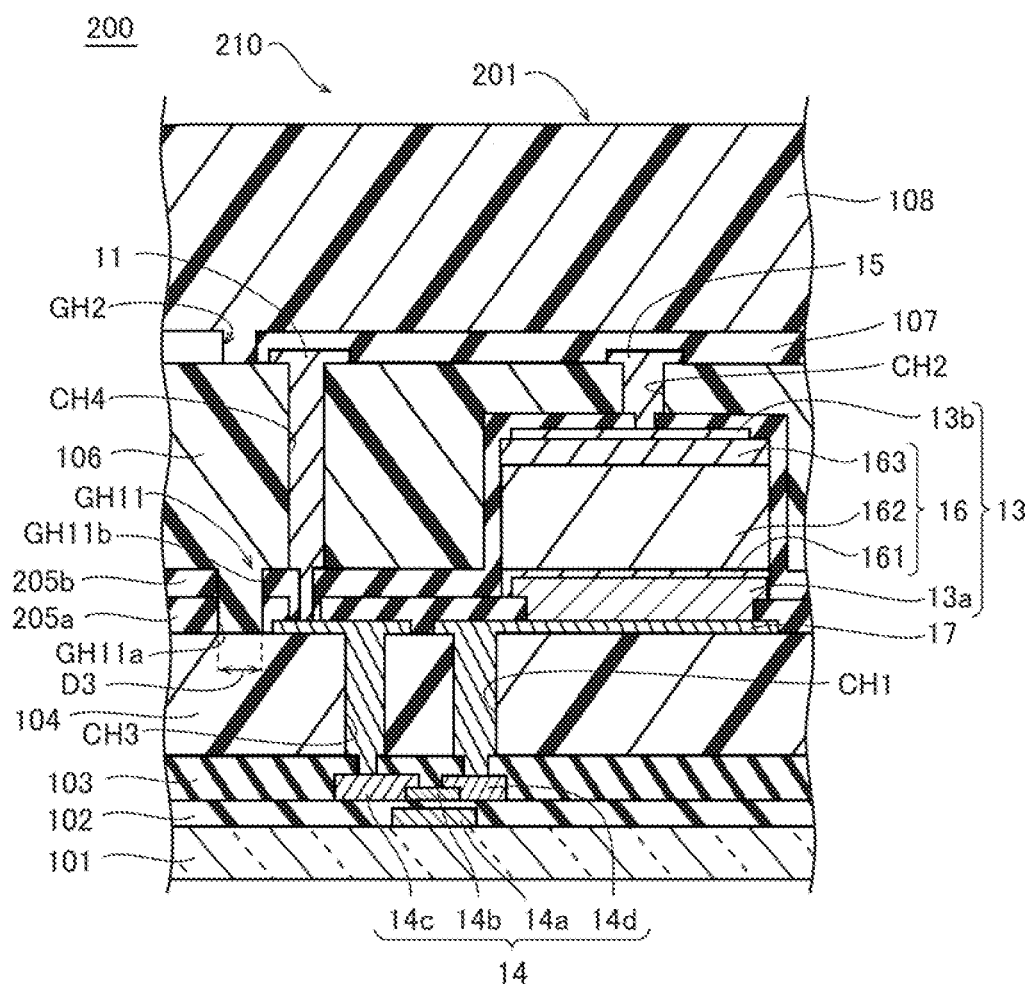
FIG. 21 illustrates an X-ray imaging device (an X-ray imaging panel and a photoelectric conversion panel) of Embodiment 2.

FIG. 21 illustrates a configuration of an X-ray imaging device 200 in Embodiment 2. In Embodiment 2, a first hole portion GH11a and a second hole portion GH11b are formed collectively at one step (S112), unlike Embodiment 1 in which the first hole portion GH1a and the second hole portion GH1b are formed at different steps (S8 and S12), respectively. Incidentally, the same constituent members and steps in manufacture as those in Embodiment 1 are denoted by the same reference symbols as those in Embodiment 1, and descriptions of the same are omitted.

(Configuration)

The X-ray imaging device 200 includes an imaging panel 210 including a photoelectric conversion panel 201, as illustrated in FIG. 21. In the photoelectric conversion panel 201, a first inorganic insulating film 205a and a second inorganic insulating film 205b are provided in place of the first inorganic insulating film 105a and the second inorganic insulating film 105b of the photoelectric conversion panel 1 of Embodiment 1, respectively. Here, in Embodiment 2, the second hole portion GH11b having a diameter D3 equal to a diameter D3 of the first hole portion GH11a of the first inorganic insulating film 205a is provided in the second inorganic insulating film 205b. This configuration enables to collectively etching the first inorganic insulating film 205a and the second inorganic insulating film 205b in the manufacture of the photoelectric conversion panel 201, thereby making it possible to collectively form the first hole portion GH11a and the second hole portion GH11b. As a result, it is possible to restrain the process of manufacturing the photoelectric conversion panel 201 from becoming complicated. Incidentally, the other parts of the configuration of Embodiment 2 are identical to those of Embodiment 1.

(Method for Manufacturing Substrate)

Figure 22:
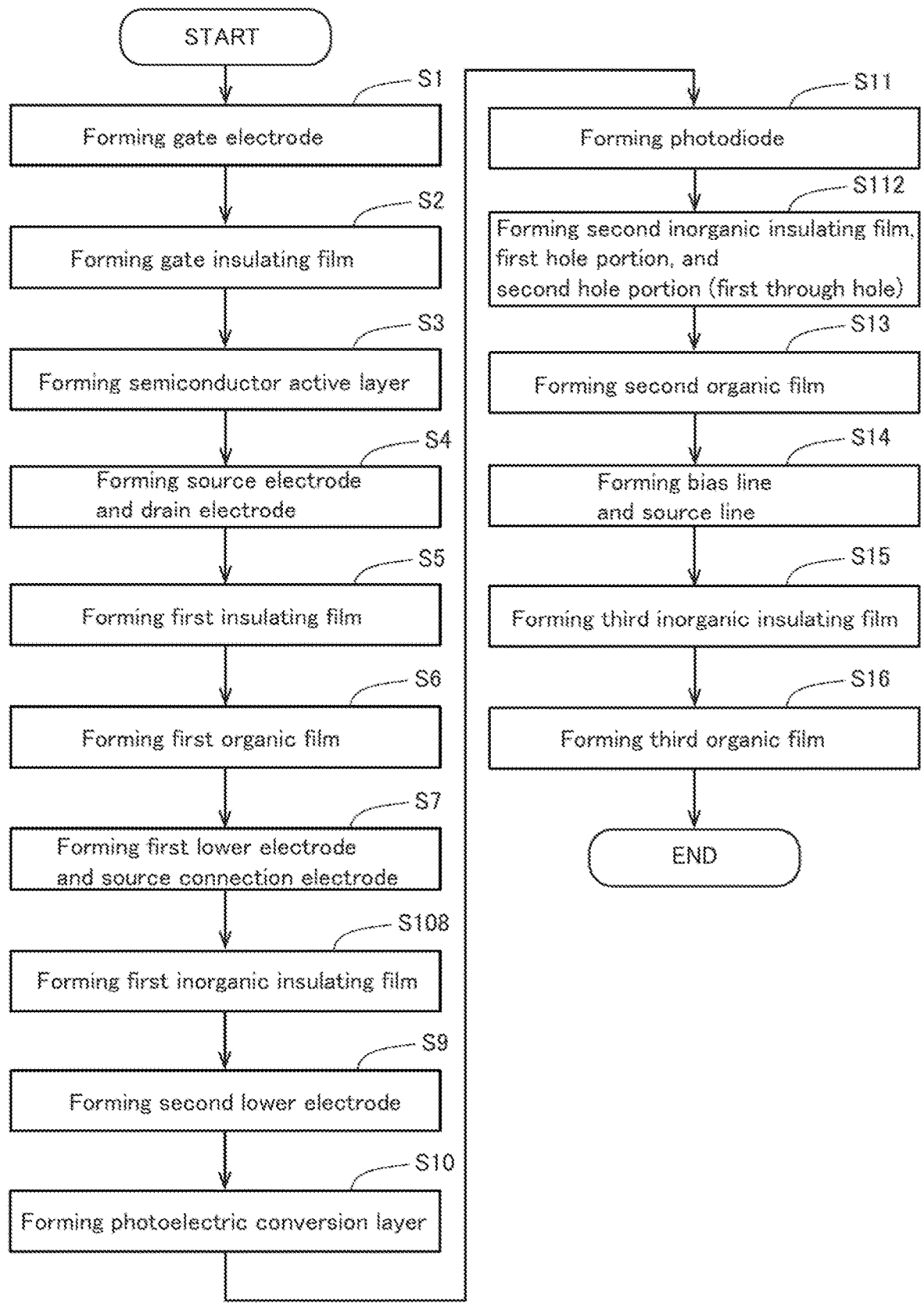
FIG. 22 is a flowchart for explaining a process for manufacturing a photoelectric conversion panel in Embodiment 2.

FIG. 22 is a flowchart for explaining a process for manufacturing a photoelectric conversion panel 201 according to Embodiment 2.

After Steps S1 to S7 are carried out, the first inorganic insulating film 205a is formed at Step S108. In Embodiment 2, the first hole portion GH11a is not formed at this step. Then, after Steps S9 to S11 are carried out, the second inorganic insulating film 205b is formed at Step S112. At this step, photolithography and dry etching are performed, whereby the first hole portion GH11a is formed in the first inorganic insulating film 205a, and the second hole portion GH11b is formed in the second inorganic insulating film 205b, collectively. As a result, the first through hole GH11 is formed. Incidentally, the other parts of the manufacturing method of Embodiment 2 are identical to those of the manufacturing method of Embodiment 1.

Embodiment 3

Figure 24:
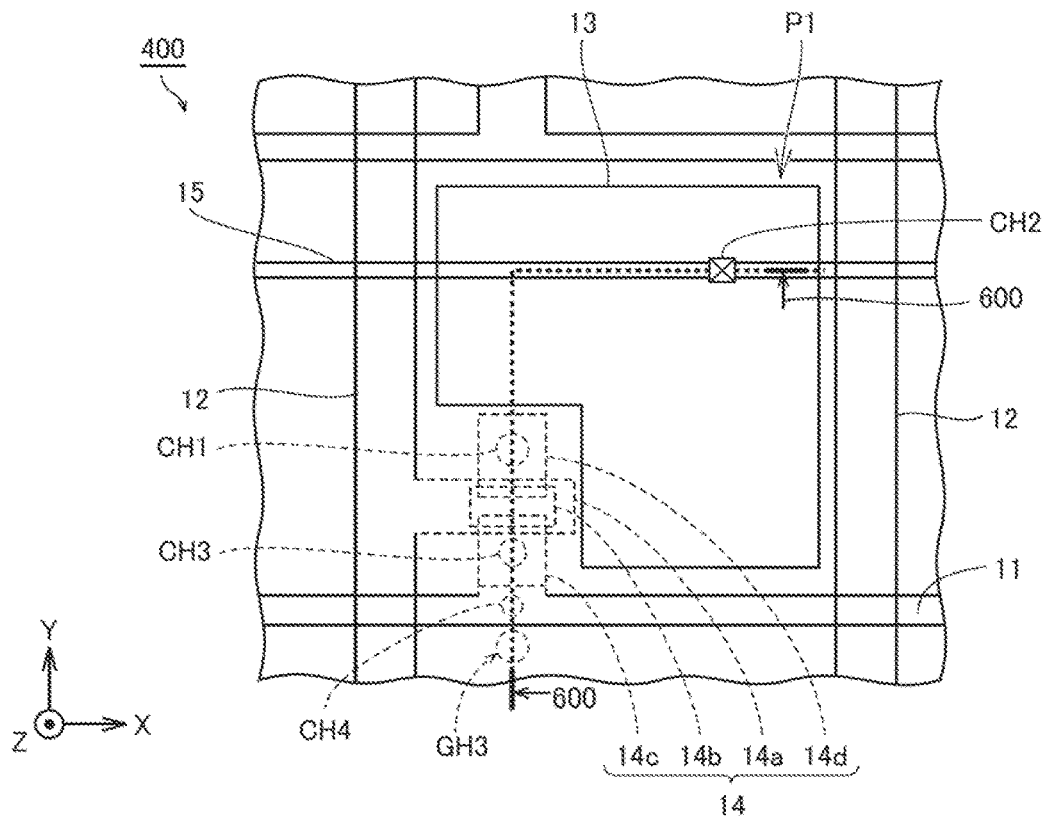
FIG. 24 is a plan view schematically illustrating a configuration of a part of a photoelectric conversion panel according to Embodiment 3.

FIG. 24 is an enlarged plan view of a part of a photoelectric conversion panel 401 according to Embodiment 3. In Embodiment 3, a portion 20, which is a part of a second inorganic insulating film 505b, is formed inside the through hole GH3. Incidentally, the same constituent members and steps in manufacture as those in Embodiment 1 are denoted by the same reference symbols as those in Embodiment 1, and descriptions of the same are omitted.

As illustrated in FIG. 24, in each of pixels P1 as areas surrounded by the gate lines 12 and the source line 11, a photodiode 13 and a TFT 14 are provided. In the photoelectric conversion panel 401, bias lines 15 connected to the photodiodes 13 are provided.

Figure 25:
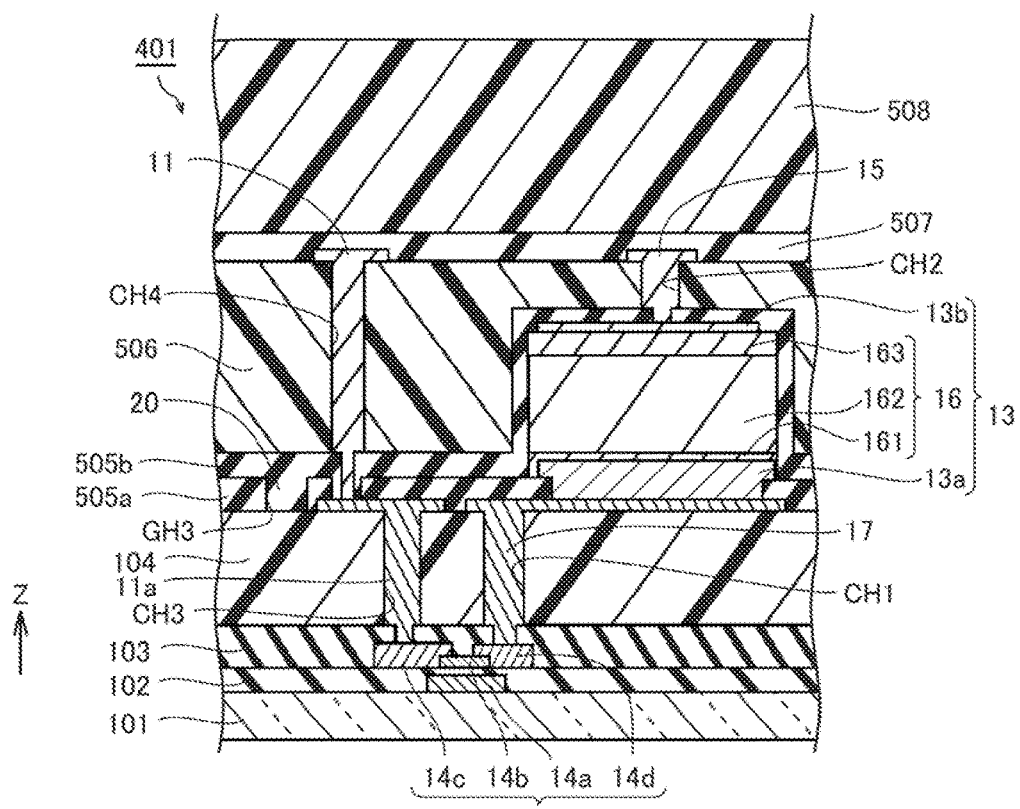
FIG. 25 illustrates a partial cross section taken along the line 600-600 in FIG. 24.

FIG. 25 is a cross-sectional view taken along line 600-600 in FIG. 24. As illustrated in FIG. 25, the photodiode 13 includes a second lower electrode 13a, an upper electrode 13b, and a photoelectric conversion layer 16. The photoelectric conversion layer 16 is provided between the second lower electrode 13a and the upper electrode 13b. The TFT 14 includes a gate electrode 14a provided integrally with the gate line 12, a semiconductor active layer 14b, a source electrode 14c connected to the source line 11, and a drain electrode 14d. Further, the photoelectric conversion panel 401 is provided with first lower electrodes 17 connected to the TFTs 14, and source connection electrodes 11a. The first lower electrode 17 is partially formed in a contact hole CH1. The drain electrode 14d and the second lower electrode 13a are connected with each other via the first lower electrode 17. Accordingly, the photodiode 13 is connected to the TFT 14 via the first lower electrode 17. Scintillation light converted by a scintillator 2 of the photoelectric conversion panel 401 is incident on the photodiode 13 from the scintillator 2 side.

As illustrated in FIG. 25, a bias line 15 is partially formed in a contact hole CH2, and supplies a bias voltage to the photodiode 13 through the contact hole CH2. The source connection electrode 11a is partially formed in a contact hole CH3, thereby being connected to the source electrode 14c via the contact hole CH3. The source line 11 is partially formed in a contact hole CH4, thereby being connected to the source connection electrode 11a via the contact hole CH4. Accordingly, the source line 11 is connected to the TFT 14.

Here, as illustrated in FIG. 25, a through hole GH3 described below is provided at a position closer to the TFT 14, as compared with the photodiode 13. Further, the through hole GH3 is provided in the vicinity of the TFT 14, but not immediately above the TFT 14. This configuration makes it possible to prevent the channel part of the TFT 14 from being damaged indirectly by dry etching, when the through hole GH3 is formed. As a result, by forming the through hole GH3, a possibility of affecting the properties of the TFT 14 can be reduced. In addition, in Embodiment 3, the through hole GH3 is formed at a position that does not overlap with the photodiode 13 and does not overlap with the first lower electrode 17 when viewed in a plan view. In the steps described below with reference to FIGS. 28 to 30 where the photodiode 13 is formed, the through hole GH3 causes a part of the first organic film 104 to be exposed.

The semiconductor active layer 14b is made of an oxide semiconductor. In Embodiment 3, the oxide semiconductor contains IGZO (In—Ga—Zn—O)-based oxide semiconductor. More specifically, for forming the oxide semiconductor, the following material may be used: $InGaO_3(ZnO)_5$; magnesium zinc oxide ($Mg_xZn_{1-x}O$); cadmium zinc oxide ($Cd_xZn_{1-x}O$); cadmium oxide (CdO); or an amorphous oxide semiconductor containing indium (In), gallium (Ga), and zinc (Zn) at a predetermined ratio. With this configuration, the oxidation by a first organic film 104 described below with respect to the TFT 14, and the reduction by the first inorganic insulating film 505a (silicon nitride) with respect to the TFT 14, are optimized, which enables to restrain the TFT from having current-voltage characteristics (I-V characteristics) of the depletion mode. In addition, the semiconductor active layer 14b containing In—Ga—Zn—O-based oxide semiconductor tends to deteriorate due to gas generated from the first organic film 104. In contrast, the above-described configuration, in which the through hole GH3 is provided in the first inorganic insulating film 505a, enables to release gas through the through hole GH3 to an upper side with respect to the first inorganic insulating film 505a in the manufacture of the photoelectric conversion panel 401. As a result, it is possible to prevent the TFT 14 from deteriorating.

As illustrated in FIG. 25, the source electrode 14c and the drain electrode 14d are arranged so as to be in contact with a part of the semiconductor active layer 14b on the gate insulating film 102. Additionally, the source electrode 14c and the drain electrode 14d are formed on the same layer. The source electrode 14c and the drain electrode 14d have, for example, a three-layer laminate structure in which a metal film made of aluminum (Al) is interposed between two meal films made of titanium (Ti).

A first insulating film 103 is provided on the gate insulating film 102, so as to overlap with the source electrode 14c and the drain electrode 14d. The first insulating film 103 has a first opening on the drain electrode 14d, and a second opening on the source electrode 14c. In this example, the first insulating film 103 is formed with, for example, an inorganic insulating film (single layer film, or laminated film) made of silicon oxide ($SiO_2$) or silicon nitride ($SiN_x$).

(Configuration of First Organic Film)

As illustrated in FIG. 25, on the first insulating film 103, the first organic film 104 is provided. In other words, the first organic film 104 is formed in an upper layer with respect to the TFT 14. The first organic film 104 is also a flattening film for the TFT 14. In the first organic film 104, the contact hole CH1 is formed, which is connected to the first opening of the first insulating film 103 on the drain electrode 14d. In addition, in the first organic film 104, the contact hole CH3 is formed, which is connected to the second opening of the first insulating film 103 on the source electrode 14c. The first organic film 104 is made of, for example, an organic transparent resin such as an acrylic resin or a siloxane-based resin. In Embodiment 3, the first organic film 104 is made of a photosensitive acrylic resin.

<Configuration of First Lower Electrode and Source Connection Electrode>

As illustrated in FIG. 25, on the first organic film 104, the first lower electrode 17 and the source connection electrode 11a are provided. The first lower electrode 17 is partially formed in the contact hole CH1, thereby connecting the drain electrode 14d and the second lower electrode 13a. The source connection electrode 11a is partially formed in the contact hole CH3, thereby connecting the source electrode 14c and the source line 11. Each of the first lower electrode 17 and the source connection electrode 11a has, for example, a three-layer laminate structure in which two metal films made of titanium (Ti) having different thicknesses (100 nm and 50 nm) are laminated so that a metal film made of aluminum (Al) (600 nm) is interposed therebetween. Incidentally, each of the first lower electrode 17 and the source connection electrode 11a may have a single layer structure made of aluminum. Here, as the first lower electrode 17 and the source connection electrode 11a contain aluminum, which has a relatively smaller resistance value, the first lower electrode 17 and the source connection electrode 11a have relatively smaller resistance values.

(Configuration of First Inorganic Insulating Film)

As illustrated in FIG. 25, on the first lower electrode 17, the first inorganic insulating film 505a is provided so as to partially cover the first lower electrode 17 and the first organic film 104. The through hole GH3 is formed in a part of the first inorganic insulating film 505a, the part being at a position that does not overlap with the first lower electrode 17 when viewed in a plan view. This configuration makes it possible to release gas through the through hole GH3 to above the first inorganic insulating film 505a, even in a case where heat for forming the photodiode 13, which is relatively thick, is transmitted to the first organic film 104, thereby causing gas to be generated from the first organic film 104, when the photodiode 13 is formed. As a result, it is possible to restrain the first inorganic insulating film 505a from separating from the first organic film 104 due to gas in the manufacture of the photoelectric conversion panel 401. In addition, this also restrains gas from accumulating in between the source connection electrode 11a as well as the first lower electrode 17 (photodiode 13), and the first organic film 104. This makes it possible to restrain the source connection electrode 11a from separating from the first organic film 104, and to restrain the photodiode 13 from separating from the first organic film 104.

The first inorganic insulating film 505a may be formed with, for example, silicon oxide ($SiO_x$), silicon nitride ($SiN_x$), silicon oxide nitride ($SiO_xN_y$) (x>y), or silicon nitride oxide ($SiN_xO_y$) (x>y). In Embodiment 3, the first inorganic insulating film 505a is formed with silicon oxynitride (SiN$_x$). Further, in the first inorganic insulating film 505a, a first opening, in which the second lower electrode 13a is to be provided, is provided on the first lower electrode 17. Still further, in the first inorganic insulating film 505a, a second opening, in which the source line 11 is to be provided, is provided on the source connection electrode 11a.

The first inorganic insulating film 505a has a thickness of, for example, 100 nm or more and 500 nm or less. This film thickness makes it possible to restrain the first lower electrode 17 from becoming exposed when the photoelectric conversion layer 16 is etched in the manufacture of the photoelectric conversion panel 401. Incidentally, in Embodiment 3, the first inorganic insulating film 505a has a thickness of, for example, 350 nm.

<Configuration of Second Lower Electrode>

As illustrated in FIG. 25, in the photoelectric conversion panel 401, the second lower electrode 13a is provided so as to cover the first opening of the first inorganic insulating film 505a and a part of the first inorganic insulating film 505a. The second lower electrode 13a is formed with titanium (Ti), which has a resistance higher than that of aluminum (Al). The second lower electrode 13a has a thickness of, for example, 10 nm or more and 50 nm or less. This film thickness makes it possible to restrain a part of the second lower electrode 13a from scattering when the photoelectric conversion layer 16 is etched in the manufacture of the photoelectric conversion panel 401. Incidentally, in Embodiment 3, the second lower electrode 13a has a thickness of 30 nm.

<Configuration of Photoelectric Conversion Layer>

As illustrated in FIG. 25, on the second lower electrode 13a, the photoelectric conversion layer 16 is provided. The photoelectric conversion layer 16 is composed of an n-type amorphous semiconductor layer 161, an intrinsic amorphous semiconductor layer 162, and a p-type amorphous semiconductor layer 163, which are laminated in the order. The n-type amorphous semiconductor layer 161 is made of amorphous silicon doped with an n-type impurity (for example, phosphorus). The intrinsic amorphous semiconductor layer 162 is made of intrinsic amorphous silicon. The intrinsic amorphous semiconductor layer 162 is formed in contact with the n-type amorphous semiconductor layer 161. The p-type amorphous semiconductor layer 163 is made of amorphous silicon doped with a p-type impurity (for example, boron). The p-type amorphous semiconductor layer 163 is formed in contact with the intrinsic amorphous semiconductor layer 162.

On the photoelectric conversion layer 16, the upper electrode 13b is provided. The upper electrode 13b is made of, for example, indium tin oxide (ITO). In other words, the photodiode 13 is formed in an upper layer with respect to the first organic film 104.

(Configuration of Second Inorganic Insulating Film)

As illustrated in FIG. 25, the second inorganic insulating film 505b is provided so as to cover at least a part of the photodiode 13 and the first inorganic insulating film 505a. The second inorganic insulating film 505b covers a part of the top surface of the photodiode 13 and side surfaces of the photodiode 13. Accordingly, the second inorganic insulating film 505b is a passivation film and a coating film for the photodiode 13, the first lower electrode 17, and the source connection electrode 11a.

Here, in Embodiment 3, a portion 20, which is a part of a second inorganic insulating film 505b, is formed inside the through hole GH3. For example, the portion 20 of the second inorganic insulating film 505b is filled inside the through hole GH3. Incidentally, gas is also generated when the second organic film 506 is formed. If this gas infiltrates the first organic film 104 through the through hole GH3 and infiltrates the TFT 14, this becomes a factor causing the TFT 14 to deteriorate. In contrast, with the above-describe configuration, the portion 20 arranged in the through hole GH3 blocks gas generated from the second organic film 506 so that the gas should not be conveyed to the TFT 14 side. As a result, it is possible to prevent the TFT 14 from deteriorating due to gas generated from the second organic film 506.

Still further, in the second inorganic insulating film 505b, a first opening is provided on the upper electrode 13b, and a second opening is provided on the source connection electrode 11a.

(Configuration of Second Organic Film)

As illustrated in FIG. 25, in the photoelectric conversion panel 401, the second organic film 506 is provided, which is formed in an upper layer with respect to the first organic film 104, and covers at least a part of the second inorganic insulating film 505b. The second organic film 506 is a flattening film for flattening step parts formed by the photodiode 13. The second organic film 506 is made of, for example, the same material as that of the first organic film 104. The second organic film 506 is made of, for example, an organic transparent resin such as an acrylic resin or a siloxane-based resin. In Embodiment 3, the second organic film 506 is made of a photosensitive acrylic resin.

Further, the contact hole CH2 connected to the first opening of the second inorganic insulating film 505b, and the contact hole CH4 connected to the second opening of the second inorganic insulating film 505b, are provided in the second organic film 506.

(Configuration of Bias Line and Source Line)

As illustrated in FIG. 25, on the second organic film 506, the bias line 15 and the source line 11 are provided. The bias line 15 is connected to the control unit 3 (see FIG. 1). The bias line 15 applies a bias voltage fed from the control unit 3 through the contact hole CH2 to the upper electrode 13b. The source line 11 is connected to the control unit 3 (see FIG. 1). The source line 11 goes through the contact hole CH4, and when the TFT 14 is turned ON, a signal according to the charges obtained by the conversion by the photodiode 13 is output through the source line 11 to the signal reading unit 3b. Each of the source line 11 and the bias line 15 is formed with, for example, a laminated metal film composed of Ti, aluminum, Ti, and ITO in this order from the bottom layer. Aluminum contained in the source line 11 and the bias line 15 contributes to the reduction of the resistance, which is important for line properties. Ti forms a barrier layer that prevents surface oxidation of aluminum. ITO contained in the source line 11 and the bias line 15 makes it possible to form a terminal for external mounting in the same layer. Incidentally, in a case where the source line 11, the bias line 15, and the terminal for external mounting are not formed in the same layer, ITO does not have to be contained in the source line 11 and the bias line 15.

(Configuration of Third Inorganic Insulating Film)

As illustrated in FIG. 25, in the photoelectric conversion panel 401, the third inorganic insulating film 507 is provided on the second organic film 506 so as to cover the second organic film 506, the source line 11 and the bias line 15. The third inorganic insulating film 507 is made of, for example, silicon nitride (SiN). Further, the third inorganic insulating film 507 is a passivation film.

(Configuration of Third Organic Film)

As illustrated in FIG. 25, in the photoelectric conversion panel 401, a third organic film 508 is provided so as to cover the third inorganic insulating film 507. The third organic film 508 is a protective film for protecting the third inorganic insulating film 507 and the like. The third organic film 508 is made of, for example, the same material as that of the second organic film 506. The third organic film 508 is made of, for example, an organic transparent resin such as an acrylic resin or a siloxane-based resin. In Embodiment 3, the third organic film 508 is made of a photosensitive acrylic resin. Incidentally, the other parts of the configuration of Embodiment 3 are identical to those of Embodiment 1.

(Method for Manufacturing Photoelectric Conversion Panel According to Embodiment 3)

Figure 26:
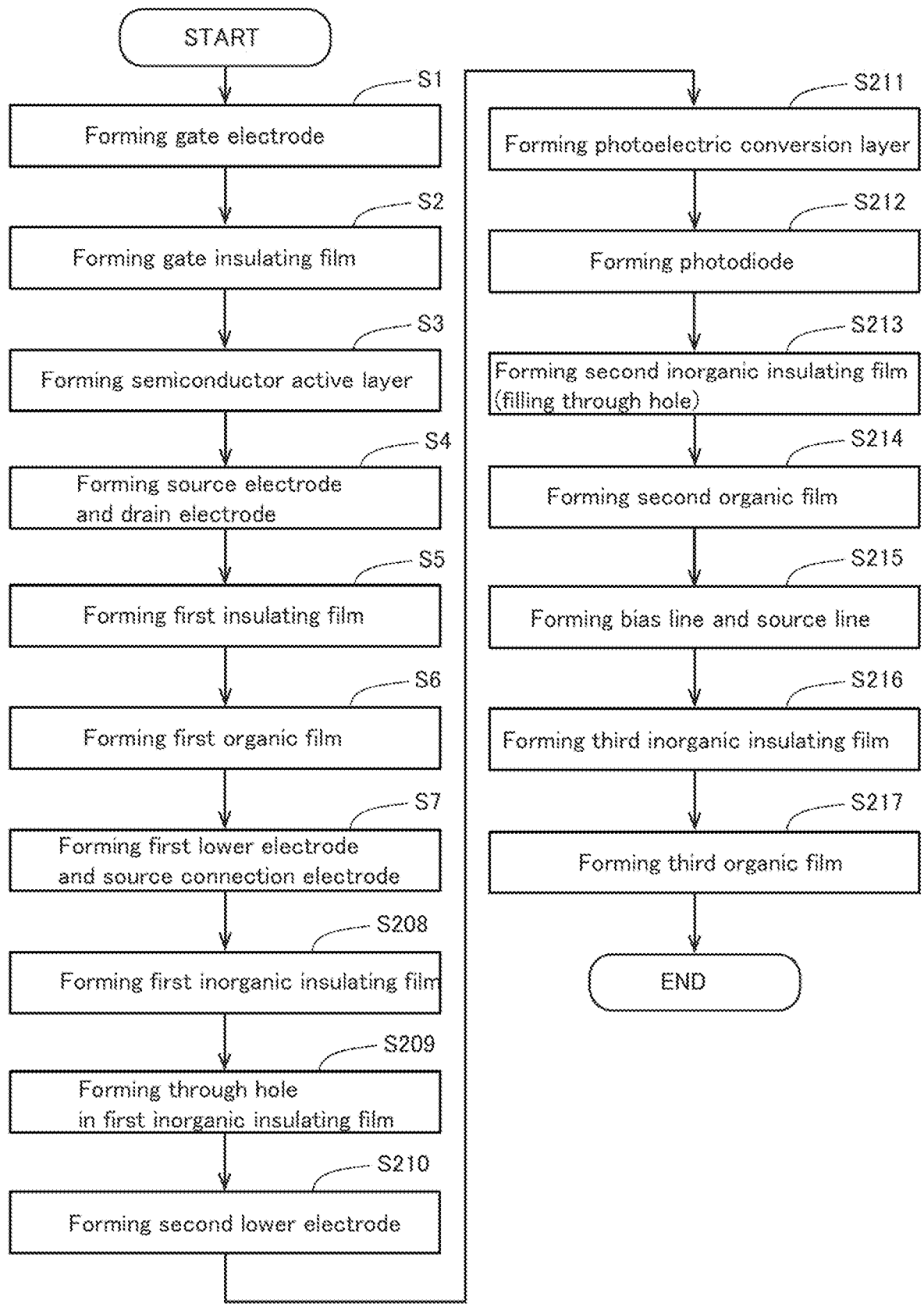
FIG. 26 is a flowchart for explaining a process for manufacturing a photoelectric conversion panel in Embodiment 3.

The following description describes a method for manufacturing the photoelectric conversion panel 401 while referring to FIGS. 26 to 35. FIG. 26 is a flowchart for explaining a process for manufacturing a photoelectric conversion panel 401. FIGS. 27 to 35 are cross-sectional views illustrating respective steps in the process for manufacturing the photoelectric conversion panel 401 (cross sections taken along line 600-600 in FIG. 24). Incidentally, the same steps as those of the manufacturing method in Embodiment 1 are denoted by the same step numbers as those in Embodiment 1, and descriptions of the same are omitted.

Figure 27:
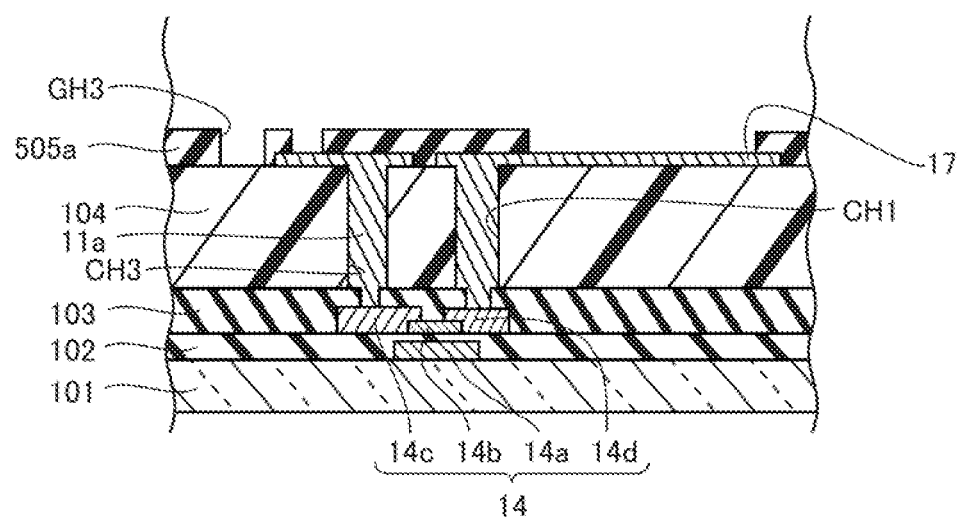
FIG. 27 is a diagram for explaining a step of forming a first inorganic insulating film in Embodiment 3.

As illustrated in FIG. 27, at Step S208, the first inorganic insulating film 505a partially covering the first lower electrode 17 and the first organic film 104 is formed on the first lower electrode 17. For example, an inorganic insulating film (single layer film) made of silicon nitride ($SiN_x$) is formed by CVD, and photolithography and dry etching are performed, whereby the first inorganic insulating film 505a is formed. Incidentally, the first inorganic insulating film 505a may be formed, not with silicon nitride ($SiN_x$), but with silicon oxide ($SiO_2$). Then, the through hole GH3 is formed in the first inorganic insulating film 505a at Step S209. Further, at this step, in the first inorganic insulating film 505a, the first opening in which a part of the second lower electrode 13a is provided is formed on the first lower electrode 17. Still further, in the first inorganic insulating film 505a, a second opening in which a part of the source line 11 is provided is formed on the source connection electrode 11a. The first inorganic insulating film 505a is formed so as to have a thickness of, for example, 100 nm or more and 500 nm or less. This film thickness makes it possible to restrain the first lower electrode 17 from becoming exposed when the photoelectric conversion layer 16 is etched (Step S212).

Figure 28:
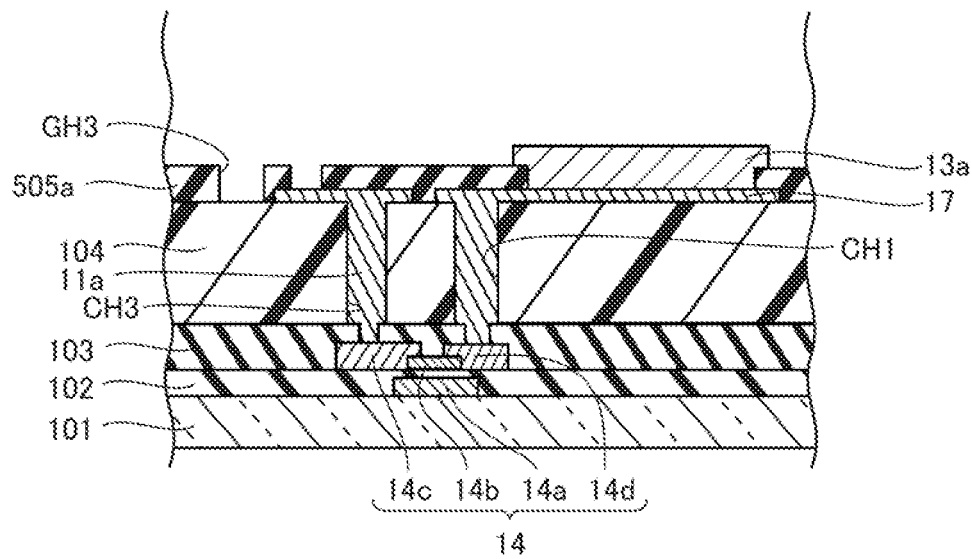
FIG. 28 is a diagram for explaining a step of forming a second lower electrode in Embodiment 3.

As illustrated in FIG. 28, at Step S210, the second lower electrode 13a is formed so as to cover the first opening of the first inorganic insulating film 505a and a part of the first inorganic insulating film 505a. For example, a metal film made of titanium (Ti) is formed by sputtering, and photolithography and dry etching are performed, whereby the second lower electrode 13a is formed. Here, surrounding parts other than the part that becomes the photoelectric conversion layer 16 are removed before the step of forming the photoelectric conversion layer 16 (Step S212). This makes it possible to restrain materials facing the side surface (side wall) of the photoelectric conversion layer 16 from scattering at the step of forming the photoelectric conversion layer 16. The second lower electrode 13a having a thickness of, for example, 10 nm or more and 50 nm or less, is formed. This film thickness makes it possible to restrain a part of the second lower electrode 13a from scattering when the photoelectric conversion layer 16 is etched. Incidentally, in Embodiment 3, the second lower electrode 13a has a thickness of 30 nm.

Figure 29:
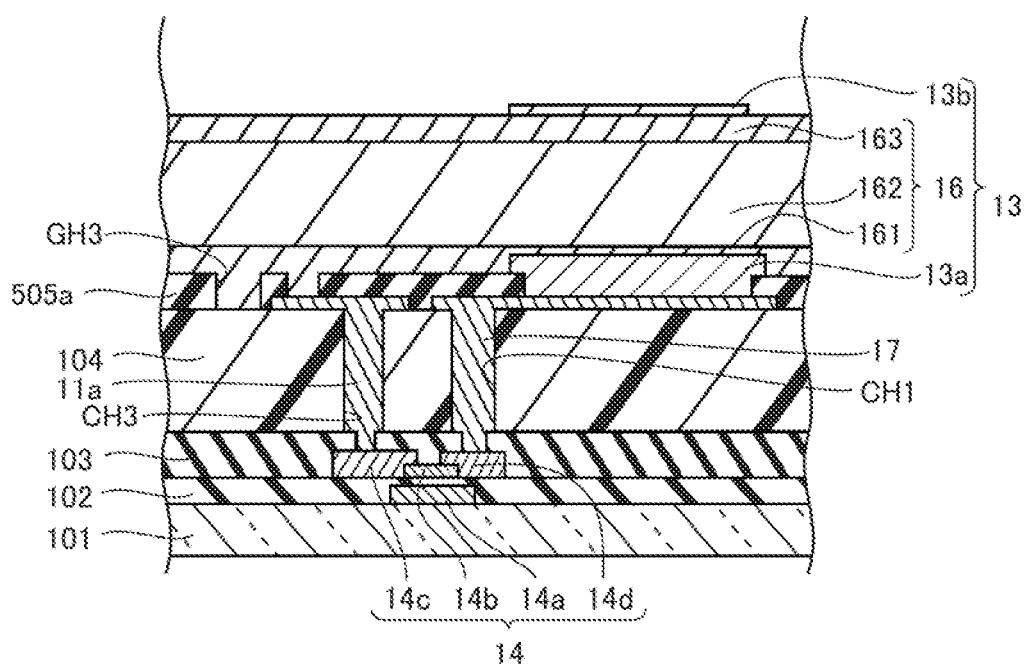
FIG. 29 is a diagram for explaining a step of forming a photoelectric conversion layer in Embodiment 3.

As illustrated in FIG. 29, at Step S211, the photoelectric conversion layer 16 is formed on the second lower electrode 13a. For example, the n-type amorphous semiconductor layer 161 made of amorphous silicon doped with an n-type impurity (for example, phosphorus), the intrinsic amorphous semiconductor layer 162 made of intrinsic amorphous semiconductor, and the p-type amorphous semiconductor layer 163 made of amorphous silicon doped with a p-type impurity (for example, boron), are laminated in this order by CVD. In this step, gas is released through the through hole GH3 to outside of the photoelectric conversion panel 401, even in a case where heat generated when the photoelectric conversion layer 16 is formed is transmitted to the first organic film 104, thereby causing gas to be generated from the first organic film 104.

Then, on the photoelectric conversion layer 16, the upper electrode 13b is formed. For example, a film of ITO is formed by sputtering. Then, photolithography and dry etching are performed, whereby the upper electrode 13b is formed. Incidentally, after the upper electrode 13b is formed, it may be treated with hydrogen plasma or the like, so that damage caused by etching of side walls of the photoelectric conversion layer 16 should be repaired. In this case, after the film of ITO is formed, a passivation film for covering the film of ITO until the etching step may be formed.

Figure 30:
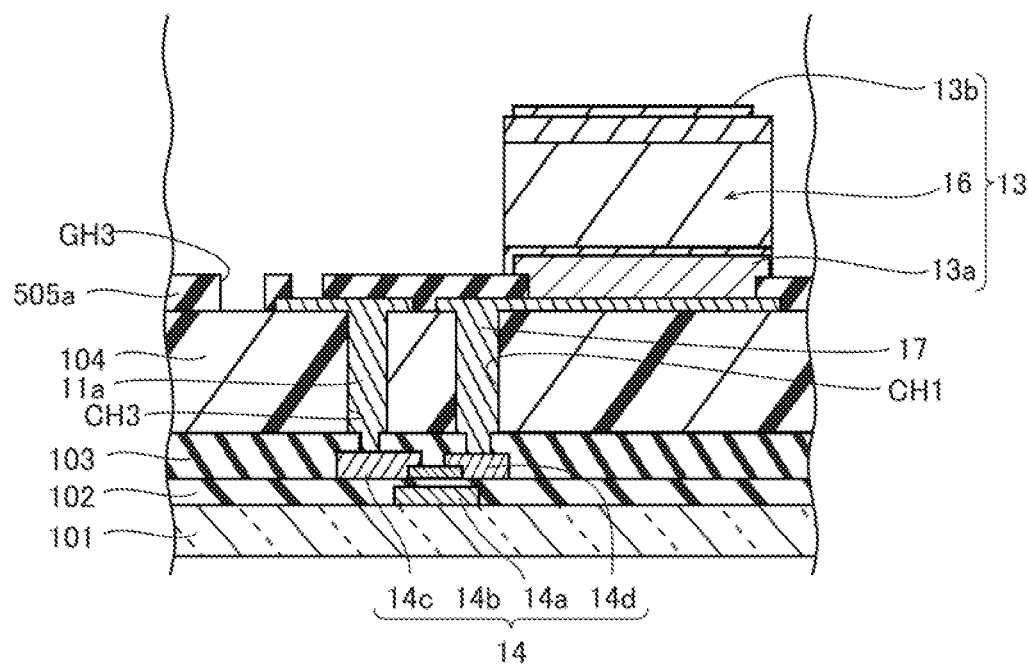
FIG. 30 is a diagram for explaining a step of forming a photodiode in Embodiment 3.

As illustrated in FIG. 30, photolithography and dry etching are performed at Step S212, whereby the photoelectric conversion layer 16 is formed, and the photodiode 13 is formed.

Figure 31:
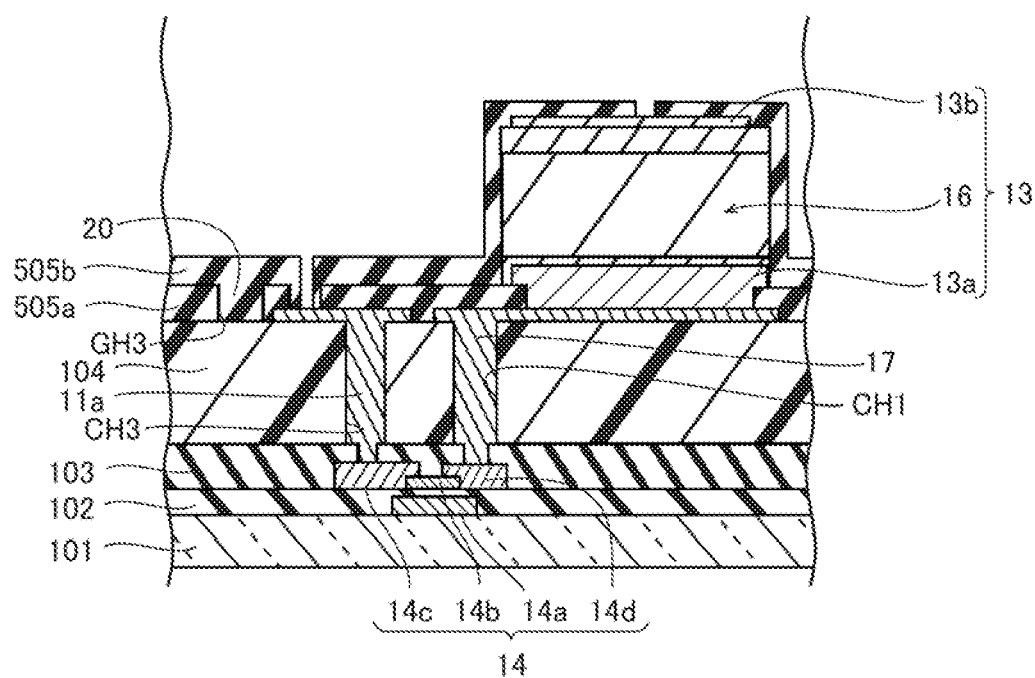
FIG. 31 is a diagram for explaining a step of forming a second inorganic insulating film in Embodiment 3.

As illustrated in FIG. 31, at Step S213, the second inorganic insulating film 505b is formed so as to cover at least a part of the photodiode 13 and the first inorganic insulating film 505a. For example, an inorganic insulating film made of silicon nitride ($SiN_x$) is formed by CVD, and photolithography and dry etching are performed, whereby the second inorganic insulating film 505b is formed. Further, at this step, the portion 20, which is a part of a second inorganic insulating film 505b, is filled inside the through hole GH3. Still further, at this step, in the second inorganic insulating film 505b, the first opening is formed on the upper electrode 13b, and the second opening is formed on the source connection electrode 11a.

Figure 32:
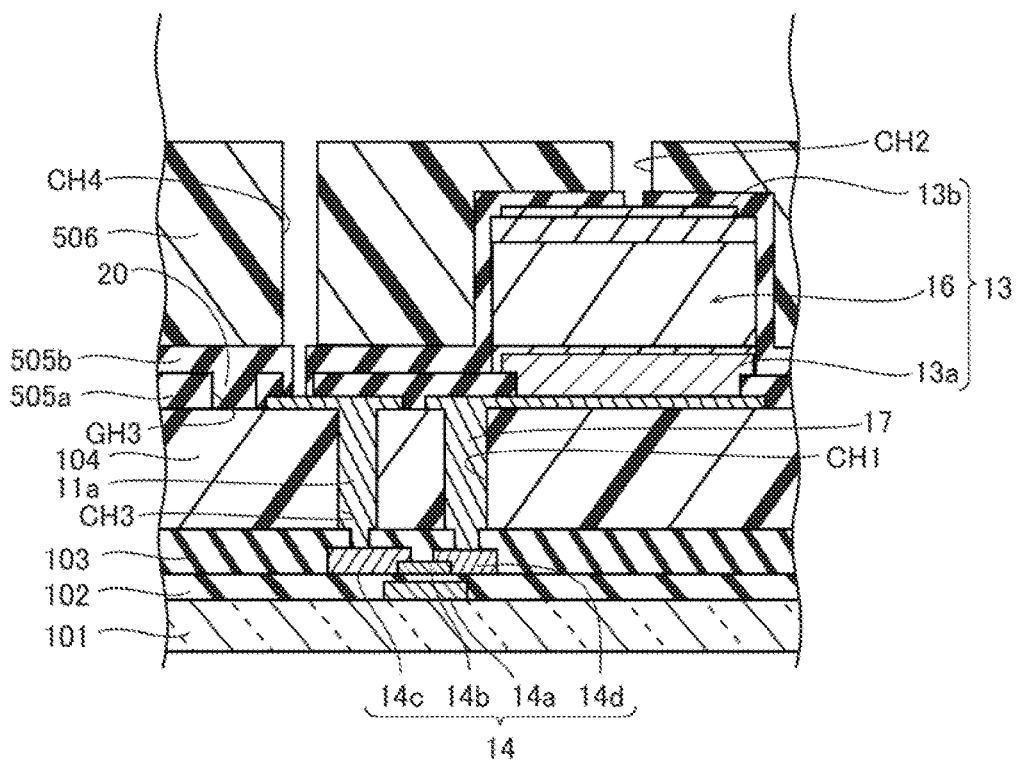
FIG. 32 is a diagram for explaining a step of forming a second organic film in Embodiment 3.

As illustrated in FIG. 32, at Step S214, the second organic film 506 is formed in an upper layer with respect to the first organic film 104, so as to cover at least a part of the second inorganic insulating film 505b. For example, by applying a photosensitive acrylic resin over the second inorganic insulating film 505b, the second organic film 506 is formed. In addition, at this step, baking (a step of heating to, for example, 200° C.) of the second organic film 506 or the photosensitive acrylic resin is carried out. Here, gas is generated from the second organic film 506 in some cases, but as the through hole GH3 is filled with the portion 20 of the second inorganic insulating film 505b, the gas is prevented from being conveyed to the TFT 14. Then, with photolithography and dry etching performed, the contact hole CH2 and the contact hole CH4 are formed in the second organic film 506.

Figure 33:
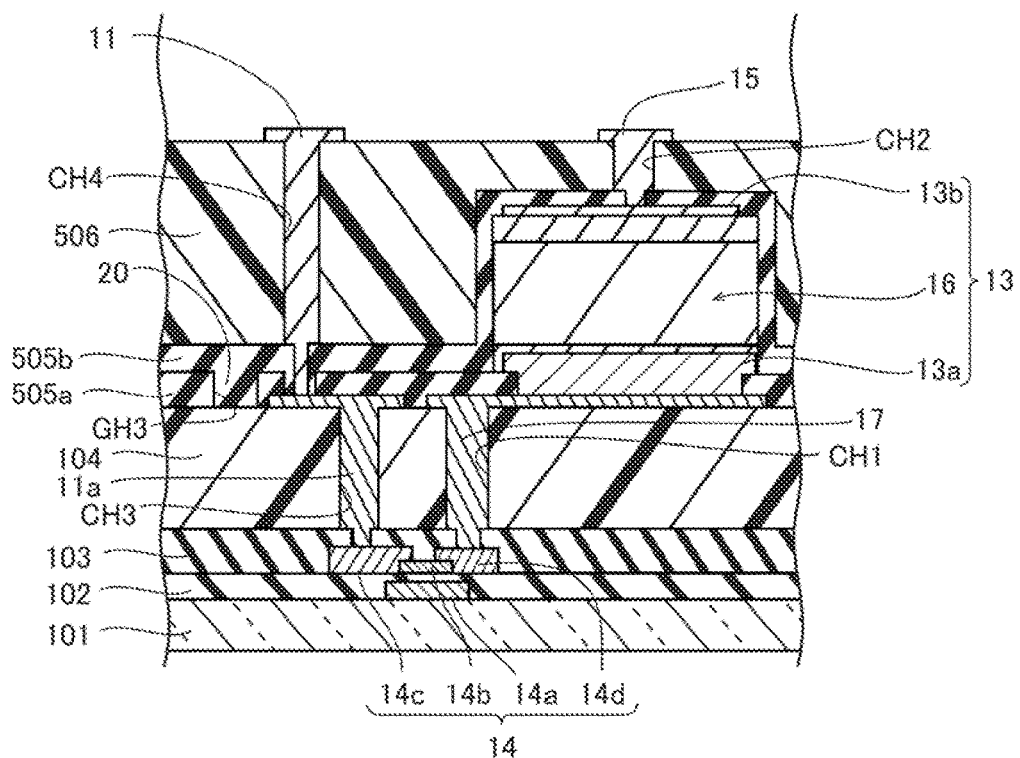
FIG. 33 is a diagram for explaining a step of forming a bias line and a source line in Embodiment 3.

As illustrated in FIG. 33, at Step S215, the bias line 15 and the source line 11 are formed on the second organic film 506. For example, an ITO film, as well as a film made of titanium (Ti), aluminum (Al), and titanium (Ti), are formed by sputtering, and wet etching as well as dry etching are performed, whereby the bias line 15 and the source line 11 are formed.

Figure 34:
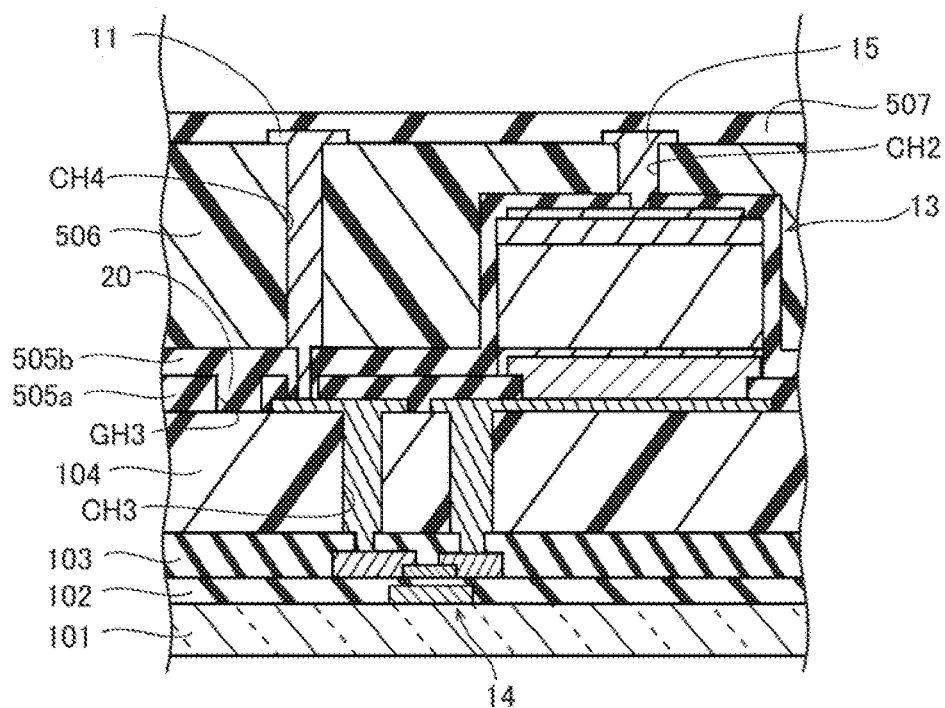
FIG. 34 is a diagram for explaining a step of forming a third inorganic insulating film in Embodiment 3.

As illustrated in FIG. 34, at Step S216, the third inorganic insulating film 507 is formed so as to cover the source line 11 and the bias line 15 on the second organic film 506. For example, an inorganic insulating film made of silicon nitride (SiN$_x$) is formed by CVD, and photolithography and dry etching are performed, whereby the third inorganic insulating film 507 is formed.

Figure 35:
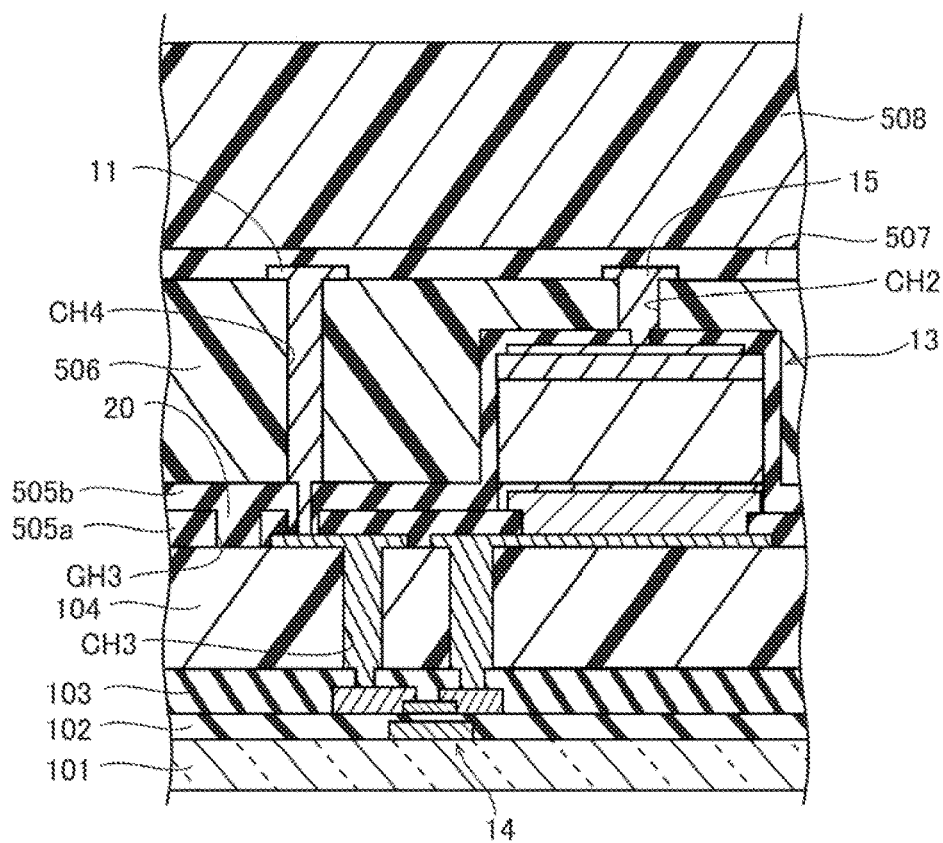
FIG. 35 is a diagram for explaining a step of forming a third organic film in Embodiment 3.

As illustrated in FIG. 35, at Step S217, the third organic film 508 is formed so as to cover the third inorganic insulating film 507. For example, by applying a photosensitive acrylic resin over the second inorganic insulating film 505b, the third organic film 508 is formed. The photoelectric conversion panel 401 is thus manufactured, then, the photoelectric conversion panel 401 and the scintillator 2 are combined, whereby the X-ray imaging panel 410 is manufactured. Then, the X-ray imaging device 400 is manufactured. Incidentally, the other parts of the manufacturing method of Embodiment 3 are identical to those of the manufacturing method of Embodiment 1.

The embodiments are thus described above, but the above-described embodiments are merely examples for implementing the present disclosure. The present disclosure, therefore, is not limited to the above-described embodiments, and the above-described embodiments can be appropriately varied and implemented without departing from the spirit and scope of the invention.

(1) Embodiments 1 to 3 are described above with reference to an example in which a photoelectric conversion panel is applied to an X-ray imaging panel for an X-ray imaging device, but they are not limited to this example. Alternatively, the above-described photoelectric conversion panel may be applied to an optical sensor panel other than an X-ray sensor panel.

(2) Embodiments 1 to 3 are described above with reference to exemplary thicknesses, materials, and forming methods of the layers (films) composing the photoelectric conversion panel, but they are not limited to this example. Alternatively, the layers (films) composing the photoelectric conversion panel may be formed with other thicknesses, other materials, and other forming methods other than those exemplary ones described above. For example, the first, second, and third organic films may be made of different organic materials, respectively. Further, the first, second, and third inorganic insulating films may be made of different inorganic materials, respectively. The TFTs may be formed with a material other than IGZO.

(3) Embodiments 1 and 2 are described above with reference to an example in which the first inorganic insulating film and the second inorganic insulating film are provided in the photoelectric conversion panel, but the configuration is not limited to this example. Alternatively, only either the first inorganic insulating film or the second inorganic insulating film may be provided in the photoelectric conversion panel; or an inorganic insulating film for forming a first through hole may be further provided in the photoelectric conversion panel, in addition to the first inorganic insulating film and the second inorganic insulating film.

(4) Embodiments 1 and 2 are described above with reference to an example in which the first inorganic insulating film covers the first lower electrode, but the configuration is not limited to this example. Alternatively, the first inorganic insulating film may be formed at such a position that it does not cover the first lower electrode.

(5) Embodiments 1 and 2 are described above with reference to an example in which the first lower electrode and the second lower electrode are provided in the photodiode, but the configuration is not limited to this example. Alternatively, a single lower electrode may be provided in the photodiode.

(6) Embodiments 1 and 2 are described above with reference to an example in which the first through hole and the second through hole are provided on a side opposite to the photodiode, with respect to the TFT, but the configuration is not limited to this example. Alternatively, the first through hole and the second through hole may be provided above the TFT, or may be provided on the photodiode side with respect to the TFT.

(7) Embodiments 1 and 2 are described above with reference to an example in which the first through hole and the second through hole are provided at positions that overlap with each other when viewed in a plan view, but the configuration is not limited to this example. Alternatively, the first through hole and the second through hole may be formed at positions different from each other (positions displaced from each other) when viewed in a plan view.

(8) Regarding Embodiments 1 and 2 described above, the first through hole and the second through hole are illustrated in FIG. 3 as having a round shape, but the configuration is not limited to this example. Alternatively, the first through hole and the second through hole may be formed in a rectangular shape, in an elliptical shape, or in a slit-like shape.

(9) Embodiments 1 and 2 are described above with reference to an example in which both of the first through hole and the second through hole are provided in the photoelectric conversion panel, but the configuration is not limited to this example. Alternatively, only the first through hole may be provided in the photoelectric conversion panel.

Figure 23:
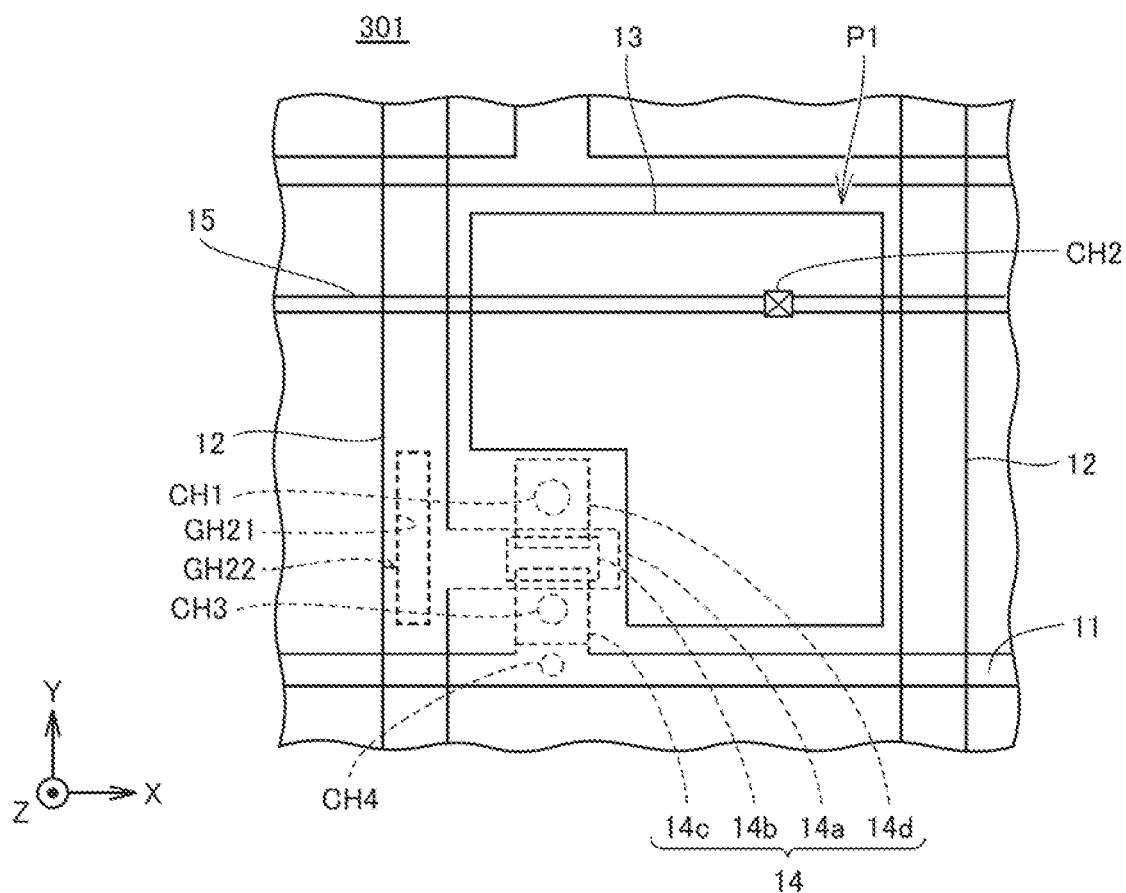
FIG. 23 is a plan view schematically illustrating a configuration of a part of a photoelectric conversion panel according to a modification example of Embodiments 1 and 2.

(10) Embodiments 1 and 2 are described above with reference to an example in which the first through hole and the second through hole are formed in a round shape, but the configuration is not limited to this example. Alternatively, as is the case with the photoelectric conversion panel 301 of the modification example illustrated in FIG. 23, the first through hole GH21 and the second through hole GH22 are formed in a rectangular shape (a quadrangular shape). For example, the first through hole GH21 and the second through hole GH22 are formed at positions overlapping with the gate line 12 when viewed in a plan view.

(11) Embodiment 3 is described above with reference to an example in which a part of the second inorganic insulating film is filled in the through hole, but the configuration is not limited to this example. Alternatively, the configuration may be such that the second inorganic insulating film is not partially filled in the through hole, but the second inorganic insulating film is formed so as to cover an inner surface of the through hole. Further alternatively, in a case where there is less possibility that gas of the second organic film would be conveyed to the TFT, the second inorganic insulating film does not have to be arranged in the through hole.

(12) Embodiment 3 is described above with reference to an example in which the first lower electrode and the second lower electrode are separately formed, but the configuration is not limited to this example. Alternatively, the first lower electrode and the second lower electrode may be integrally formed.

(13) Regarding Embodiment 3 described above, the through hole is illustrated in FIG. 24 as having a round shape, but the configuration is not limited to this example.

Alternatively, the through hole may be formed in a rectangular shape, in an elliptical shape, or in a slit-like shape.

The above-described photoelectric conversion panel, and the method for manufacturing the photoelectric conversion panel can be described as follows.

A photoelectric conversion panel of a first configuration includes: a thin film transistor; a first organic film formed in an upper layer with respect to the thin film transistor; a photoelectric conversion element formed in an upper layer with respect to the first organic film; a first inorganic layer formed so as to cover at least a part of the photoelectric conversion element, and to cover the first organic film; and a second organic film formed in an upper layer with respect to the first organic film, wherein the first inorganic layer has a first through hole that connects the first organic film and the second organic film (the first configuration).

In this case, heat generated in the heating step in the second organic film forming process is transmitted via the first inorganic layer to the first organic film. Therefore, when the first organic film already formed is heated, gas is generated in some cases from the first organic film. In the conventional configuration, the gas thus generated from the first organic film then pushes up the already formed first inorganic layer, thereby separating the first inorganic layer from the first organic film (loosening the first inorganic layer). In contrast, the first configuration makes it possible to release gas through the first through hole to the second organic film side, even in a case where heat for forming the second organic film is transmitted to the first organic film, thereby causing gas to be generated from the first organic film, in the manufacture of the photoelectric conversion panel. Then, this gas can be released through the second organic film from the photoelectric conversion panel to outside. This restrains gas from accumulating in between the first inorganic layer and the second organic film. As a result, it is possible to restrain the first inorganic layer from separating from the first organic film in the manufacture of the photoelectric conversion panel, even in a case where the photoelectric conversion panel includes the first organic film and the second organic film.

The first configuration may be further characterized in that the photoelectric conversion element includes a pair of electrodes, and a semiconductor layer provided between the pair of electrodes, and the first inorganic layer includes a first inorganic insulating film that covers at least a part of a lower electrode connected to the thin film transistor, the lower electrode being one of the pair of electrodes, and that includes a first hole portion that composes at least a part of the first through hole (the second configuration).

With the second configuration, gas from the first organic film can be released through the first hole portion (the first through hole) of the first inorganic insulating film to the second organic film side. This restrains gas from accumulating in between the lower electrode (photoelectric conversion element) and the first organic film. As a result, it is possible to restrain the lower electrode (photoelectric conversion element) from separating from the first organic film.

The second configuration may be further characterized in that the first inorganic layer further includes a second inorganic insulating film that covers at least a part of the first inorganic insulating film and has a second hole portion that composes at least a part of the first through hole (the third configuration).

The third configuration enables to release gas from the first organic film to the second organic film side through the first hole portion of the first inorganic insulating film and second hole portion (the first through hole) of the second inorganic insulating film, in the manufacture of the photoelectric conversion panel, even in a case where the second inorganic insulating film covering at least a part of the first inorganic insulating film is provided in the photoelectric conversion panel.

The third configuration may be further characterized in that the second hole portion is provided in the second inorganic insulating film, at a position overlapping with the first hole portion when viewed in a plan view (the fourth configuration).

The fourth configuration allows the first hole portion and the second hole portion to be easily connected, thereby making it possible to form the first through hole in the photoelectric conversion panel easily.

The fourth configuration may be further characterized in that the second inorganic insulating film is formed so as to cover at least a part of the photoelectric conversion element, and is provided with the second hole portion at a position that does not overlap with the photoelectric conversion element when viewed in a plan view, and the second organic film covers at least a part of the second inorganic insulating film, and is filled in the second hole portion (the fifth configuration).

This fifth configuration allows the first organic film and the second organic film to be easily connected, even in a case where the photoelectric conversion element is provided in the photoelectric conversion panel. As a result, it is possible to easily release gas from the first organic film to the second organic film side in the manufacture of the photoelectric conversion panel.

The fourth or fifth configuration may be further characterized in that the first hole portion having a first diameter is provided in the first inorganic insulating film, and the second hole portion having a second diameter equal to the first diameter is provided in the second inorganic insulating film (the sixth configuration).

The sixth configuration enables to collectively etching the first inorganic insulating film and the second inorganic insulating film in the manufacture of the photoelectric conversion panel, thereby making it possible to collectively form the first hole portion and the second hole portion. As a result, it is possible to restrain the process of manufacturing the photoelectric conversion panel from becoming complicated, even in a case where the first hole portion and the second hole portion are formed.

Any of the first to sixth configurations may be further characterized in further including a third organic film formed in an upper layer with respect to the second organic film, and a second inorganic layer that is formed so as to cover the second organic film and in which a second through hole for connecting the second organic film and the third organic film is provided (the seventh configuration).

The seventh configuration enables to release gas generated from the second organic film to the third organic film side through the second through hole in the manufacture of the photoelectric conversion panel, even in a case where the third organic film is provided in the photoelectric conversion panel. Then, gas can be released through the third organic film from the photoelectric conversion panel to outside. As a result, it is possible to restrain the second inorganic layer from separating from the second organic film.

The seventh configuration may be further characterized in that the second through hole is provided in the second inorganic layer, at a position overlapping with the first through hole when viewed in a plan view (the eighth configuration).

The eighth configuration makes it possible to form the second through hole easily, as compared with a case where the second through hole is formed at a position different from that of the first through hole when viewed in a plan view.

Any one of the first to eighth configurations may be further characterized in that the thin film transistor contains In—Ga—Zn—O-based oxide semiconductor, and the first inorganic layer contains silicon nitride (the ninth configuration).

With the ninth configuration, the oxidation by the first organic film with respect to the thin film transistor, and the reduction by the first inorganic layer with respect to the thin film transistor, are optimized, which enables to restrain the thin film transistor from having current-voltage characteristics of the depletion mode.

A method for producing a photoelectric conversion panel according to a tenth configuration includes: forming a thin film transistor; forming a first organic film in an upper layer with respect to the thin film transistor; forming a photoelectric conversion element in an upper layer with respect to the first organic film; forming a first inorganic layer so that the first inorganic layer covers at least a part of the photoelectric conversion element, and covers the first organic film; and forming a second organic film in an upper layer with respect to the first organic film, wherein the forming of the first inorganic layer includes providing a first through hole in the first inorganic layer so that the through hole connects the first organic film and the second organic film (the tenth configuration).

With the tenth configuration, it is possible to provide a method for producing a photoelectric conversion panel that makes it possible to restrain the first inorganic layer from separating from the first organic film in the manufacture of the photoelectric conversion panel, even in a case where the photoelectric conversion panel includes the first organic film and the second organic film.

The method for manufacturing a photoelectric conversion panel according to the tenth configuration may be further characterized in that: the forming of the photoelectric conversion element includes: forming a lower electrode connected to the thin film transistor; and forming a semiconductor layer, and an upper electrode that, together with the lower electrode, interposes the semiconductor layer, the forming of the first inorganic layer includes: forming a first inorganic insulating film that covers at least a part of the first organic film and covers at least a part of the lower electrode, and the forming of the through hole includes forming, in the first inorganic insulating film, a first hole portion that composes at least a part of the through hole (the eleventh configuration).

With the eleventh configuration, gas from the first organic film can be released through the first hole portion (the first through hole) of the first inorganic insulating film to the second organic film side.

The method for manufacturing a photoelectric conversion panel according to the eleventh configuration may be further characterized in that: the forming of the first inorganic layer includes: forming a second inorganic insulating film that covers at least a part of the first inorganic insulating film in which the first hole portion is formed, and at least a part of the photoelectric conversion element; and the forming of the through hole includes forming a second hole portion that composes at least a part of the through hole, in the second inorganic insulating film, at a position overlapping with the first hole portion when viewed in a plan view (the twelfth configuration).

The twelfth configuration allows the first hole portion and the second hole portion to be easily connected, thereby making it possible to form the first through hole in the photoelectric conversion panel easily.

The method for manufacturing a photoelectric conversion panel according to the eleventh configuration may be further characterized in that: the forming of the first inorganic layer includes: forming a second inorganic insulating film that covers at least a part of the first inorganic insulating film in which the first hole portion is formed, and at least a part of the photoelectric conversion element; and the forming of the through hole includes forming a through hole by etching a part of the first inorganic insulating film and a part of the second inorganic insulating film together (the thirteenth configuration).

The thirteenth configuration makes it possible to form the first hole portion and the second hole portion collectively, thereby restraining the process of manufacturing the photoelectric conversion panel from becoming complicated, even in a case where the first hole portion and the second hole portion are formed.

A photoelectric conversion panel according to a fourteenth configuration includes: a thin film transistor; a first organic film formed in an upper layer with respect to the thin film transistor; a photoelectric conversion element formed in an upper layer with respect to the first organic film; and a first inorganic insulating film formed so as to cover at least a part of the first organic film, wherein the first inorganic insulating film has a through hole that exposes a part of the first organic film (the fourteenth configuration).

With the fourteenth configuration, it is possible to prevent the first inorganic insulating film from separating from the first organic film in the manufacture of the photoelectric conversion panel.

A photoelectric conversion panel according to the fifteenth configuration includes: a thin film transistor; a first organic film formed in an upper layer with respect to the thin film transistor, having a contact hole formed therein; a lower electrode formed in an upper layer with respect to the first organic film, the lower electrode being connected to the thin film transistor via the contact hole; a first inorganic insulating film covering a part of the lower electrode; and a photoelectric conversion element formed in an upper layer with respect to the lower electrode, the photoelectric conversion element being connected to the lower electrode, wherein the first inorganic insulating film has a through hole that exposes a part of the first organic film at a position that does not overlap with the lower electrode when viewed in a plan view (the fifteenth configuration).

Here, the photoelectric conversion element is heated for a longer time, as it has a greater thickness, as compared with other layers of the photoelectric conversion panel. Therefore, when the first organic film already formed is heated for a long time, gas is generated in some cases from the first organic film. In the conventional configuration, the gas thus generated from the first organic film then pushes up the already-formed inorganic insulating film, thereby separating the inorganic insulating film from the first organic film. In contrast, the fifteenth configuration makes it possible to release gas through the through hole to an upper side with respect to the first inorganic insulating film, even in a case where heat for forming the photoelectric conversion element is transmitted to the first organic film, thereby causing gas to be generated from the first organic film, when the photoelectric conversion element is formed. As a result, it is possible to prevent the first inorganic insulating film from separating from the first organic film due to gas in the manufacture of the photoelectric conversion panel. Further, this also restrains gas from accumulating in between the photoelectric conversion element and the first organic film. Thereby it is possible to prevent the photoelectric conversion element from separating from the first organic film. As a result of these, it is possible to prevent the first inorganic insulating film from separating from the first organic film in the manufacture of the photoelectric conversion panel.

The fifteenth configuration may be further characterized in that the photoelectric conversion panel further includes: a second inorganic insulating film that covers at least a part of the first inorganic insulating film and at least a part of the photoelectric conversion element; a second organic film formed in an upper layer with respect to the second inorganic insulating film, wherein at least a part of the second inorganic insulating film is arranged in the through hole (the sixteenth configuration).

Here, gas is also generated when the second organic film is formed. In a case where this gas infiltrates the first organic film through the through hole and infiltrates the thin film transistor, this becomes a factor causing the thin film transistor to deteriorate. In contrast, with the sixteenth configuration, gas generated from the second organic film is blocked by the second inorganic insulating film having a portion arranged in the through hole, whereby the gas is prevented from being conveyed to the thin film transistor side. As a result, it is possible to prevent the thin film transistor from deteriorating due to gas generated from the second organic film.

Any one of the first to sixteenth configurations may be further characterized in that the thin film transistor contains In—Ga—Zn—O-based oxide semiconductor, and the first inorganic insulating film contains silicon nitride (the seventeenth configuration).

With the seventeenth configuration, the oxidation by the first organic film with respect to the thin film transistor, and the reduction by the first inorganic insulating layer with respect to the thin film transistor, are optimized, which enables to restrain the thin film transistor from having current-voltage characteristics of the depletion mode. In addition, the thin film transistor containing In—Ga—Zn—O-based oxide semiconductor tends to deteriorate due to gas generated from the first organic film. In contrast, the above-described sixteenth configuration, in which the through hole is provided in the first inorganic insulating film, enables to release gas through the through hole to an upper side with respect to the first inorganic insulating film. As a result, it is possible to prevent the thin film transistor from deteriorating.

A method for manufacturing a photoelectric conversion panel according to the eighteenth configuration includes: forming a thin film transistor; forming a first organic film in an upper layer with respect to the thin film transistor; forming a photoelectric conversion element in an upper layer with respect to the first organic film; forming a first inorganic insulating film so as to cover at least a part of the first organic film; and forming, in the first inorganic insulating film, a through hole that exposes a part of the first organic film (the eighteenth configuration).

With the eighteenth configuration, as is the case with the fourteenth configuration, it is possible to prevent the first inorganic insulating film from separating from the first organic film in the manufacture of the photoelectric conversion panel.

A method for manufacturing a photoelectric conversion panel according to the nineteenth configuration includes: forming a thin film transistor; forming a first organic film in an upper layer with respect to the thin film transistor; forming a contact hole in the first organic film; forming a lower electrode in an upper layer with respect to the first organic film, the lower electrode being connected to the thin film transistor via the contact hole; forming a first inorganic insulating film covering a part of the lower electrode; forming a through hole that exposes a part of the first organic film, in the first inorganic insulating film, at a position that does not overlap with the lower electrode when viewed in a plan view; and forming a photoelectric conversion element connected to the lower electrode, in an upper layer with respect to the lower electrode (the nineteenth configuration).

With the nineteenth configuration, as is the case with the fourteenth configuration, it is possible to prevent the first inorganic insulating film from separating from the first organic film in the manufacture of the photoelectric conversion panel.

The nineteenth configuration may be further characterized in further including: forming a second inorganic insulating film that covers at least a part of the first inorganic insulating film and at least a part of the photoelectric conversion element, at least a part of the second inorganic insulating film being arranged in the through hole; and forming a second organic film in an upper layer with respect to the second inorganic insulating film (the twentieth configuration).

With the twentieth configuration, gas generated from the second organic film is blocked by the second inorganic insulating film having a portion arranged in the through hole, whereby the gas is prevented from being conveyed to the thin film transistor side. As a result, it is possible to prevent the thin film transistor from deteriorating due to gas generated from the second organic film.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A photoelectric conversion panel comprising:
   a thin film transistor;
   a first organic film formed above the thin film transistor;
   a photodiode formed above the first organic film; and
   a first inorganic insulating film formed to cover at least a part of the first organic film,
   wherein the first inorganic insulating film has a through hole that exposes a part of the first organic film.

2. The photoelectric conversion panel according to claim 1, further comprising:
   a second organic film formed above the first organic film,
   wherein the second organic film is connected to the first organic film at the through hole in the first inorganic insulating film.

3. The photoelectric conversion panel according to claim 2, further comprising:
   a second inorganic insulating film that covers at least a part of the first inorganic insulating film and has a hole portion in communication with the through hole of the first inorganic insulating film.

4. The photoelectric conversion panel according to claim 3,
   wherein the second inorganic insulating film covers at least a part of the photodiode,
   the hole portion of the second inorganic insulating film is formed at a position that does not overlap the photodiode when viewed in a plan view, and the second organic film covers at least a part of the second inorganic insulating film and fills in the hole portion of the second inorganic insulating film.

5. The photoelectric conversion panel according to claim 3,
wherein the through hole of the first inorganic insulating film has a first diameter, and
wherein the hole portion of the second inorganic insulating film has a second diameter equal to the first diameter.

6. The photoelectric conversion panel according to claim 2, further comprising:
a third organic film formed above the second organic film; and
a third inorganic insulating film formed to cover the second organic film, and provided with a through hole that connects the second organic film and the third organic film.

7. The photoelectric conversion panel according to claim 6,
wherein the through hole of the third inorganic insulating film is provided at a position overlapping the through hole of the first inorganic insulating film when viewed in a plan view.

8. The photoelectric conversion panel according to claim 1, further comprising:
a lower electrode formed above the first organic film, the lower electrode connecting the photodiode and the thin film transistor,
wherein the through hole of the first inorganic insulating film exposes a part of the first organic film at a position that does not overlap the lower electrode when viewed in a plan view.

9. The photoelectric conversion panel according to claim 8, further comprising:
a second inorganic insulating film that covers at least a part of the first inorganic insulating film and at least a part of the photodiode; and
a second organic film formed above the second inorganic insulating film,
wherein at least a part of the second inorganic insulating film is arranged in the through hole.

10. The photoelectric conversion panel according to claim 1,
wherein the thin film transistor contains In—Ga—Zn—O-based oxide semiconductor, and
the first inorganic insulating film contains silicon nitride.

11. A method for manufacturing a photoelectric conversion panel comprising:
forming a thin film transistor;
forming a first organic film above the thin film transistor;
forming a photodiode above the first organic film;
forming a first inorganic insulating film to cover at least a part of the first organic film; and
forming, in the first inorganic insulating film, a through hole that exposes a part of the first organic film.

12. The method for manufacturing a photoelectric conversion panel according to claim 11, further comprising:
forming a second organic film above the first organic film,
wherein the forming of the through hole in the first inorganic insulating film includes forming, in the first inorganic insulating film, a through hole that connects the first organic film and the second organic film.

13. The method for manufacturing a photoelectric conversion panel according to claim 12, further comprising:
forming a second inorganic insulating film that covers at least a part of the first inorganic insulating film in which the through hole is formed, and at least a part of the photodiode; and
forming a hole portion in communication with the through hole, in the second inorganic insulating film, at a position overlapping the through hole when viewed in a plan view.

14. The method for manufacturing a photoelectric conversion panel according to claim 12, further comprising:
forming a second inorganic insulating film that covers at least a part of the first inorganic insulating film, and at least a part of the photodiode, before the through hole is formed,
wherein the forming of the through hole includes etching a part of the first organic insulating film and a part of the second inorganic insulating film together to form the through hole, and a hole portion in communication with the through hole, in the second inorganic insulating film, at a position overlapping the through hole when viewed in a plan view.

15. The method for manufacturing a photoelectric conversion panel according to claim 11, further comprising:
forming a lower electrode connected to the thin film transistor above the first organic film,
wherein the forming of the first inorganic insulating film includes forming the first inorganic insulating film such that the first inorganic insulating film covers a part of the lower electrode,
the forming of the through hole includes forming the through hole such that the through hole exposes a part of the first organic film, in the first inorganic insulating film, at a position that does not overlap the lower electrode when viewed in a plan view, and
the forming of the photodiode includes forming the photodiode such that the photodiode is connected to the lower electrode above the lower electrode.

16. The method for manufacturing a photoelectric conversion panel according to claim 15, further comprising:
forming a second inorganic insulating film that covers at least a part of the first inorganic insulating film and at least a part of the photodiode,
wherein the forming of the second inorganic insulating film includes forming the second inorganic insulating film such that at least a part thereof is formed in the through hole; and
forming a second organic film above the second inorganic insulating film.

* * * * *